United States Patent
Aimono

(10) Patent No.: US 9,097,897 B2
(45) Date of Patent: Aug. 4, 2015

(54) OPTICAL DEFLECTOR INCLUDING NARROW PIEZOELECTRIC SENSOR ELEMENT BETWEEN TORSION BAR AND PIEZOELECTRIC ACTUATOR

(71) Applicant: STANLEY ELECTRIC CO., LTD., Meguro-ku, Tokyo (JP)

(72) Inventor: Takanori Aimono, Tokyo-to (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 59 days.

(21) Appl. No.: 14/023,126

(22) Filed: Sep. 10, 2013

(65) Prior Publication Data

US 2014/0071507 A1   Mar. 13, 2014

(30) Foreign Application Priority Data

Sep. 11, 2012   (JP) ................. 2012-199364

(51) Int. Cl.
*G02B 26/10* (2006.01)
*G02B 26/08* (2006.01)
*H01L 41/08* (2006.01)

(52) U.S. Cl.
CPC ............ *G02B 26/10* (2013.01); *G02B 26/0858* (2013.01); *H01L 41/0825* (2013.01)

(58) Field of Classification Search
CPC .................................................. H01L 41/0825
USPC .......... 359/196.1, 197.1, 198.1, 199.1, 199.2, 359/199.3, 199.4, 200.6, 200.7, 200.8, 359/202.1, 212.1, 213.1, 226.2; 399/216
See application file for complete search history.

(56) References Cited

U.S. PATENT DOCUMENTS

| | | | |
|---|---|---|---|
| 5,488,862 A | 2/1996 | Neukermans et al. | |
| 5,648,618 A | 7/1997 | Neukermans et al. | |
| 2008/0297868 A1* | 12/2008 | Mizumoto | 359/199 |
| 2009/0185253 A1 | 7/2009 | Tani et al. | |
| 2010/0092213 A1* | 4/2010 | Fujii et al. | 399/216 |
| 2010/0195180 A1 | 8/2010 | Akanuma et al. | |

(Continued)

FOREIGN PATENT DOCUMENTS

| | | |
|---|---|---|
| EP | 2 495 600 A1 | 9/2012 |
| JP | 2010-197994 A | 9/2010 |

(Continued)

OTHER PUBLICATIONS

Extended European Search Report (EESR) dated Dec. 5, 2013 (in English) in counterpart European Application No. 13020089.2.

*Primary Examiner* — Scott J Sugarman
*Assistant Examiner* — William R Alexander
(74) *Attorney, Agent, or Firm* — Holtz, Holtz, Goodman & Chick PC

(57) ABSTRACT

In an optical deflector including a mirror, a support frame surrounding the mirror, at least one torsion bar arranged along an axis of the mirror having an end coupled to an outer circumference of the mirror, a pair of piezoelectric actuators arranged between the support frame and the torsion bar, and a piezoelectric sensor inserted between the torsion bar and one of the piezoelectric actuators, the piezoelectric sensor includes at least one piezoelectric sensor element having a width being smaller than two-fifths of a width of the one of the piezoelectric actuators and being arranged at a wide portion within two-fifths of the width from an inner end of the one of the piezoelectric actuators.

18 Claims, 26 Drawing Sheets

(56) References Cited

U.S. PATENT DOCUMENTS

2012/0162739 A1* 6/2012 Yamada .................... 359/212.1
2012/0224240 A1   9/2012 Aimono et al.

FOREIGN PATENT DOCUMENTS

| JP | 2011-150055 A | 8/2011 |
| WO | WO 95/24652 A1 | 9/1995 |

* cited by examiner

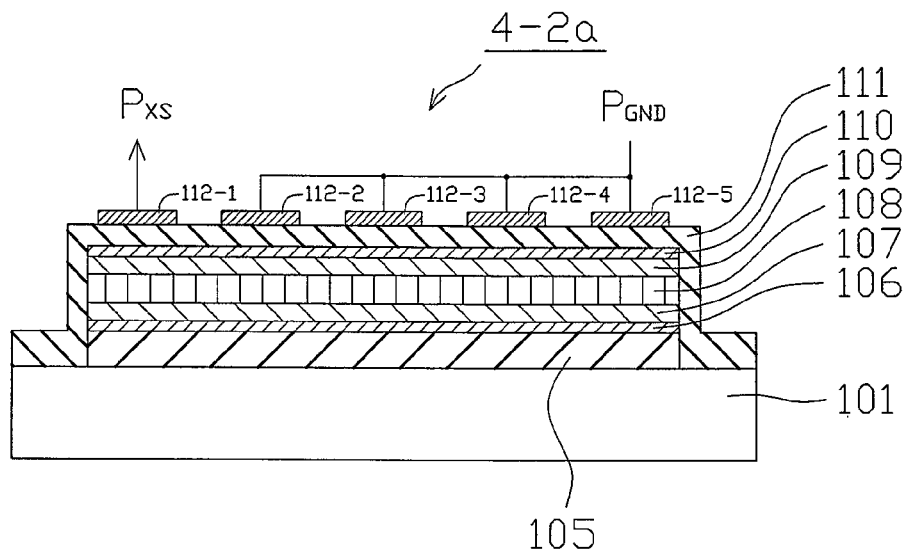
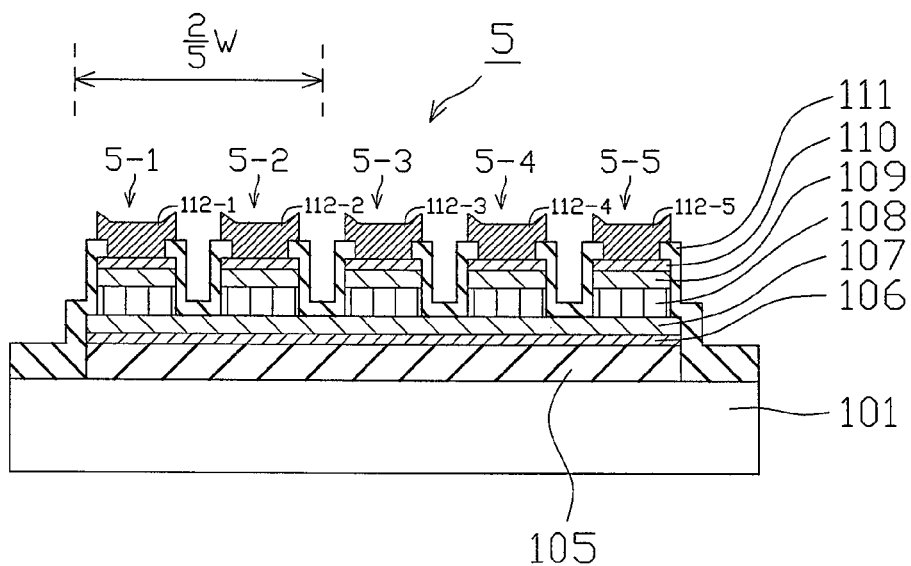

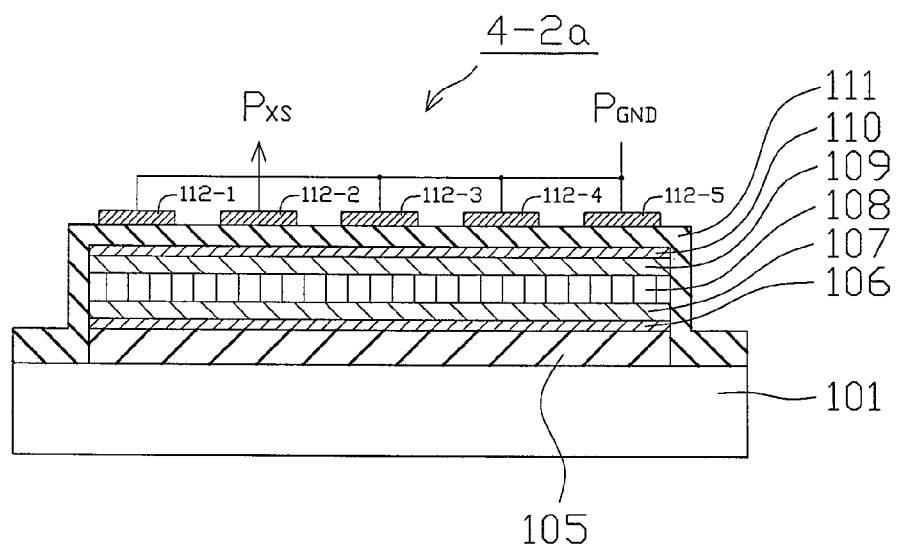
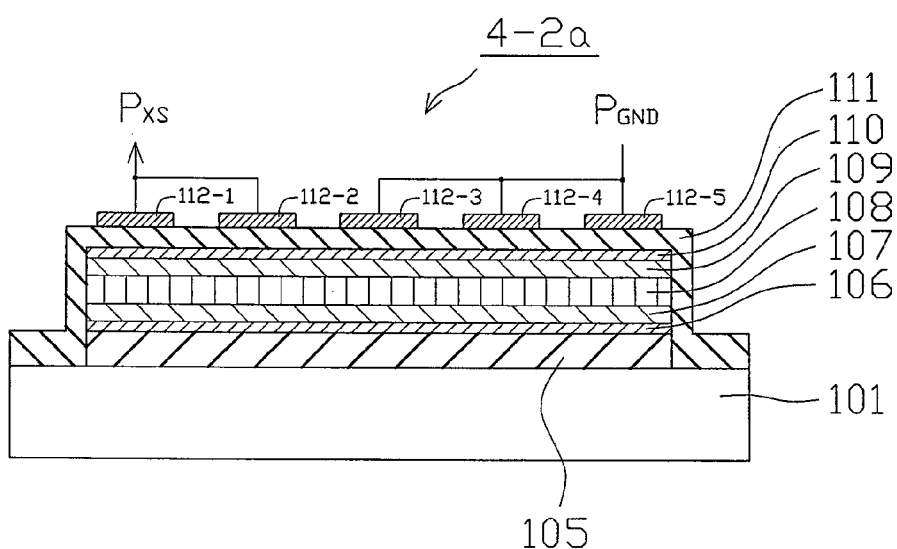

US 9,097,897 B2

OPTICAL DEFLECTOR INCLUDING NARROW PIEZOELECTRIC SENSOR ELEMENT BETWEEN TORSION BAR AND PIEZOELECTRIC ACTUATOR

This application claims the priority benefit under 35 U.S.C. §119 to Japanese Patent Application No. JP2012-199364 filed on Sep. 11, 2012, which disclosure is hereby incorporated in its entirety by reference.

BACKGROUND

1. Field

The presently disclosed subject matter relates to an optical deflector used as a scanner in a projector, a bar code reader, a laser printer, a laser read amplifier, ahead-up display apparatus or the like.

2. Description of the Related Art

Recently, in a projector or the like, a spotlight is deflected by an optical deflector and then, is projected on a screen. Such an optical deflector is a micro electro mechanical system (MEMS) device manufactured by semiconductor manufacturing processes and micro machine technology.

A first prior art one-dimensional optical deflector is constructed by a circular mirror, a support frame surrounding the circular mirror, a pair of torsion bars connected between the support frame and the circular mirror, piezoelectric actuators provided between the support frame and the torsion bars for vibrating (rocking) the circular mirror through the torsion bars with respect to an axis of the circular mirror, and two semi-ring-shaped piezoelectric sensors provided at a circumference of the circular mirror for sensing rocking vibrations caused by the piezoelectric actuators (see: FIG. 1 of JP2011-150055).

The above-described first prior art one-dimensional optical deflector has, however, the following problems:

a) Since the semi-ring-shaped piezoelectric actuators are also rocked in association with rocking of the mirror, the resonant frequency thereof would be decreased.

b) Since conductive layers located from the semi-ring-shaped piezoelectric sensors on the circular mirror through the torsion bars to pads on the support frame are very long, the resonant frequency of the circular mirror is also affected by the weight of the conductive layers, so that the resonant frequency of the circular mirror would fluctuate from an optimum design value.

c) When one of the semi-ring-shaped piezoelectric sensors is expanded, and the other semi-ring-shaped piezoelectric sensor is retracted, the sense voltages of the two semi-ring-shaped piezoelectric sensors opposite in phase to each other would be compensated for by each other, thus reducing the entire detected sense voltages of the semi-ring-shaped piezoelectric sensors.

In a second prior art one-dimensional optical deflector, one piezoelectric sensor is provided between one of the torsion bars and one of the piezoelectric actuators on the same beam as that of the one of the piezoelectric actuators, thus solving all the problems of the above-described first prior art one-dimensional-optical deflector (see: FIGS. 16, 17 and 18 of JP2010-197994A & US2010/0195180A1).

In the above-described second prior art one-dimensional optical deflector, however, since the width of the piezoelectric sensor is the same as that of the piezoelectric actuators, the accuracy of the sense voltage of the piezoelectric sensor with respect to a resonant frequency is insufficient. As a result, even when the frequency of sinusoidal-wave drive voltages for the piezoelectric actuators is controlled by the sense voltage of the piezoelectric sensor, a resonant state cannot be realized. This will be discussed in detail later.

Note that, if a resonant state cannot be realized, it would be required to increase the drive voltages for the piezoelectric actuators in order to obtain a desired deflection angle of the circular mirror.

SUMMARY

The presently disclosed subject matter seeks to solve one or more of the above-described problems.

According to the presently disclosed subject matter, in an optical deflector including a mirror, a support frame surrounding the mirror, at least one torsion bar arranged along an axis of the mirror having an end coupled to an outer circumference of the mirror, a pair of piezoelectric actuators arranged between the support frame and the torsion bar, and a piezoelectric sensor inserted between the torsion bar and one of the piezoelectric actuators, the piezoelectric sensor includes at least one piezoelectric sensor element the width thereof being smaller than two-fifths of the width of the one of the piezoelectric actuators and being arranged at a wide portion within two-fifths of the width from an inner end of the one of the piezoelectric actuators.

According to the presently disclosed subject matter, since the piezoelectric sensor element is narrow within two-fifths of the width from an inner end of the one of the piezoelectric actuators, a resonant state can be realized by the feedback control of a sense voltage of the piezoelectric sensor element to drive voltages of the piezoelectric actuators.

BRIEF DESCRIPTION OF THE DRAWINGS

The above and other advantages and features of the presently disclosed subject matter will be more apparent from the following description of certain embodiments, taken in conjunction with the accompanying drawings, wherein:

FIG. 4 is a cross-sectional view of the optical deflector taken along the line IV-IV in FIG. 2;

FIG. 5 is a cross-sectional view of the optical deflector taken along the line V-V in FIG. 2;

FIG. 9 is a cross-sectional view illustrating a modification of FIG. 4;

FIG. 10 is a cross-sectional view illustrating another modification of FIG. 4;

DETAILED DESCRIPTION OF EXEMPLARY EMBODIMENTS

Figure 1:
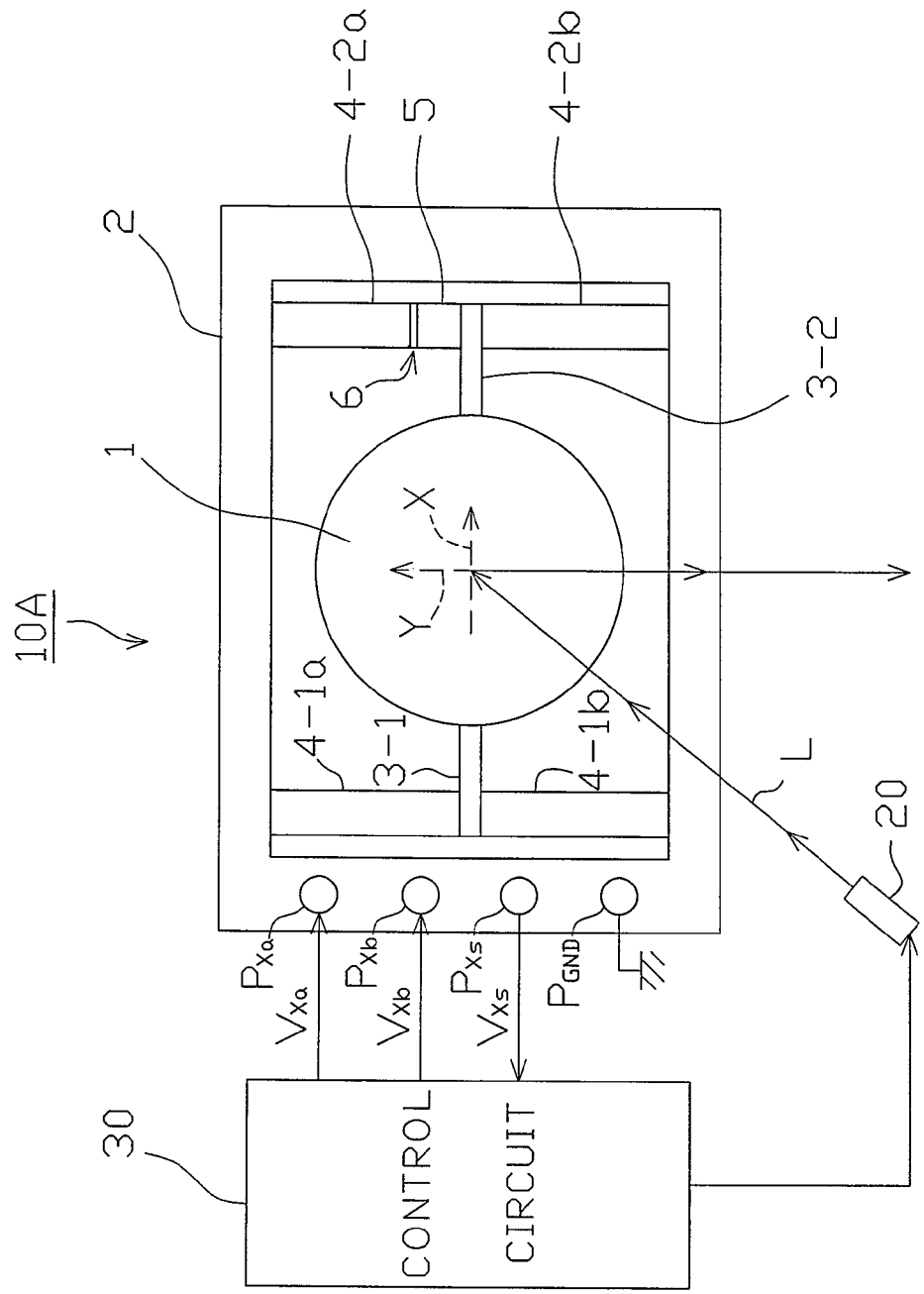
FIG. 1 is a plan view illustrating a first embodiment of the optical deflector according to the presently disclosed subject matter.

In FIG. 1, which illustrates a first embodiment of the optical deflector according to the presently disclosed subject matter, a one-dimensional optical deflector 10A is constructed by a circular mirror 1 for reflecting a spotlight L from a laser diode 20, a rectangular support frame 2 surrounding the circular mirror 1, a pair of torsion bars 3-1 and 3-2 arranged along an X-axis of the circular mirror 1 coupled to the outer circumference of the circular mirror 1, a pair of linear piezoelectric actuators 4-1a and 4-1b arranged between the rectangular support frame 2 and the torsion bar 3-1, a pair of linear piezoelectric actuators 4-2a and 4-2b arranged between the rectangular support frame 2 and the torsion bar 3-2, and a piezoelectric sensor 5 inserted between the torsion bar 3-2 and the linear piezoelectric actuator 4-2a. Also, a groove 6 is provided to separate the piezoelectric sensor 5 from the linear piezoelectric actuator 4-2a.

In FIG. 1, the circular mirror 1 is supported by a four-point support at the rectangular support frame 2.

The linear piezoelectric actuators 4-1a, 4-1b, 4-2a and 4-2b serve as cantilevers for rocking the circular mirror 1 with respect to the X-axis through the torsion bars 3-1 and 3-2.

In more detail, the linear piezoelectric actuator 4-1a opposes the linear piezoelectric actuator 4-1b along the Y-axis of the circular mirror 1 perpendicular to the X-axis thereof and sandwich the torsion bar 3-1. In this case, the flexing direction of the linear piezoelectric actuator 4-1a is opposite to that of the linear piezoelectric actuator 4-1b. Similarly, the linear piezoelectric actuator 4-2a opposes the linear piezoelectric actuator 4-2b along the Y-axis and sandwich the torsion bar 3-2. In this case, the flexing direction of the linear piezoelectric actuator 4-2a is opposite to that of the linear piezoelectric actuator 4-2b. Therefore, the torsion bars 3-1 and 3-2 are twisted by the linear piezoelectric actuators 4-1a, 4-1b, 4-2a and 4-2b to rock the circular mirror 1 with respect to the X-axis.

Provided on the rectangular support frame 2 are pads $P_{Xa}$, $P_{Xb}$, $P_{XS}$ and $P_{GND}$. The pads $P_{Xa}$, $P_{Xb}$ and $P_{XS}$ are connected to a control circuit 30 which is constructed by a microcomputer or the like, while the pad $P_{GND}$ is grounded.

The control circuit 30 supplies a sinusoidal-wave drive voltage $V_{Xa}$ to the pad $P_{Xa}$ which is connected to the Pt upper electrode layer 109 (shown not in FIG. 1, but in FIGS. 4, 6, 9, 10 and 11) of the linear piezoelectric actuators 4-1a and 4-2a, thus driving the linear piezoelectric actuators 4-1a and 4-2a. On the other hand, the control circuit 30 supplies a sinusoidal-wave drive voltage $V_{Xb}$ opposite in phase to the sinusoidal-wave drive voltage $V_{Xa}$ to the pad $P_{Xb}$ which is connected to the Pt upper electrode layer 109 (shown not in FIG. 1, but in FIGS. 4, 6, 9, 10 and 11) of the linear piezoelectric actuators 4-1b and 4-2b, thus driving the linear piezoelectric actuators 4-1b and 4-2b.

Also, the control circuit 30 receives a sense voltage $V_{XS}$ from the pad $P_{XS}$ which is connected to the Pt upper electrode layer 109 (shown not in FIG. 1, but in FIGS. 5, 6 and 12) of the piezoelectric sensor 5, and controls the sinusoidal-wave drive voltages $V_{Xa}$ and $V_{Xb}$ by the feedback of the sense voltage $V_{XS}$ supplied thereto.

Note that the pad $P_{GND}$ is connected to the lower electrode layer 107 (shown not in FIG. 1, but in FIGS. 4, 5, 6, 9, 10, 11, 12 and 13) of the linear piezoelectric actuators 4-1a, 4-1b, 4-2a, 4-2b and the piezoelectric sensor 5.

Further, the control circuit 30 controls the laser diode 20 to turn ON and OFF the spotlight L. As occasion demands, the control circuit 30 may adjust the laser diode 20 to change the light amount of the spotlight L.

Figure 2:
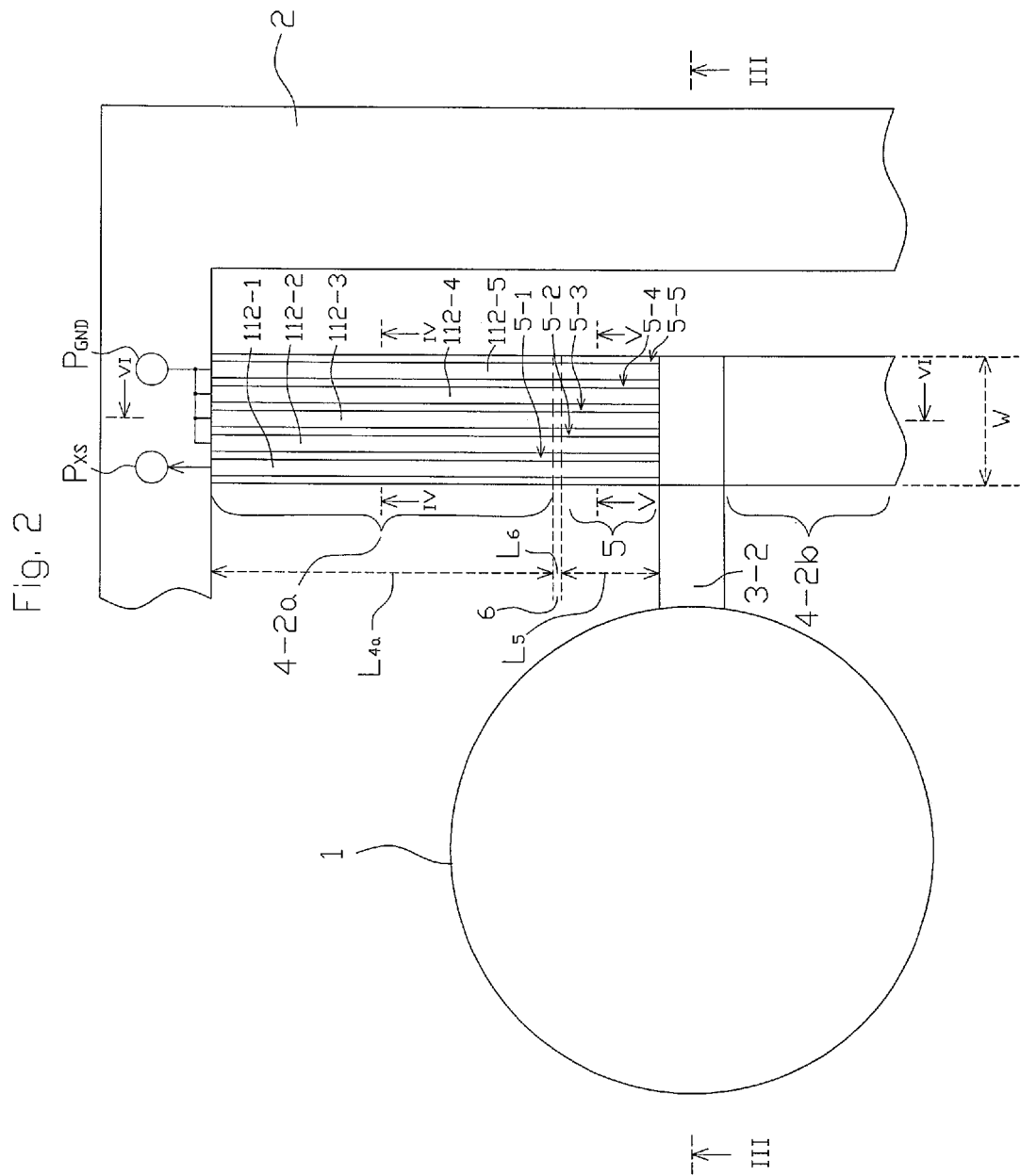
FIG. 2 is a partial enlargement of the optical deflector of FIG. 1.

In FIG. 2, which is a partial enlargement of the one-dimensional optical deflector 10A of FIG. 1, the lengths of the linear piezoelectric actuator 4-2a and the piezoelectric sensor 5 are defined by $L_{4a}$ and $L_5$, respectively. In this case, $$L_{4a}/6 < L_5 < L_{4a}/3$$

Note that the length $L_g$ of the groove 6 is very small and can be negligible.

When $L_5 \leq L_{4a}/6$, the sense voltage $V_{XS}$ of the piezoelectric sensor 5 is too small. On the other hand, when $L_5 \leq L_{4a}/3$, the drive force of the piezoelectric actuator 4-2a is too small.

Also, the width of the linear piezoelectric actuators 4-2a and 4-2b and the piezoelectric sensor 5 is representatively defined by W.

The piezoelectric sensor 5 is divided into five piezoelectric sensor elements 5-1, 5-2, 5-3, 5-4 and 5-5 which are equidistantly arranged along the width direction. That is, the width of each of the piezoelectric sensor elements 5-1, 5-2, 5-3, 5-4 and 5-5 is W/5. The piezoelectric sensor element 5-1 is connected via a conductive layer 112-1 over the linear piezoelectric actuator 4-2a to the pad $P_{XS}$ on the rectangular support frame 2, while the piezoelectric sensor elements 5-2, 5-3, 5-4 and 5-5 are connected via conductive layers 112-2, 112-3, 112-4 and 112-5 over the linear piezoelectric actuator 4-2a to the pad $P_{GND}$ on the rectangular support frame 2. In other words, the Pt upper electrode layers of the piezoelectric sensor elements 5-2, 5-3, 5-4 and 5-5 are grounded, so that the piezoelectric sensor elements 5-2, 5-3, 5-4 and 5-5 are inactivated.

In FIGS. 3, 4, 5 and 6, which are cross-sectional views of the optical deflector of FIG. 2 taken along the line the line IV-IV, the line V-V and the line VI-VI, respectively, in FIG. 2, an about 40 µm thick silicon "Device" layer 101, an about 2 µm thick silicon dioxide "Box" layer 102 and an about 400 µm thick silicon "Handle" layer 103 are formed by using a silicon-on-insulator (SOI) wafer.

Also, about 500 nm thick silicon dioxide layers 104 and 105 are formed on both surfaces of the SOI wafer.

Further, an about 50 nm thick Ti (or $TiO_x$) contact layer 106 is formed on the silicon dioxide layer 105, and an about 150 nm thick Pt lower electrode layer 107 is formed on the contact layer 106. Also, an about 3 µm thick lead titanate zirconate $PbZrTiO_2$ (PZT) piezoelectric layer 108 is formed on the Pt lower electrode layer 107. Further, an about 150 nm thick Pt upper electrode layer 109 and an about 50 nm thick Ti contact layer 110 are formed on the PZT layer 108.

Still further, an about 500 nm thick silicon dioxide layer 111 is formed on the Ti contact layer 110 and is patterned to form contact holes in the silicon dioxide layer 111. The above-mentioned conductive layers 112-1, 112-2, 112-3, 112-4 and 112-5 and conductive layers (not shown) for the pads $P_{Xa}$, $P_{Xb}$, $P_{GND}$ and $P_{XS}$ are made of about 500 nm thick Al or Au and are formed in the contact holes of the silicon dioxide layer 111.

Furthermore, a Ti contact layer 113 and an Ag reflective layer 114 are formed.

Figure 3:
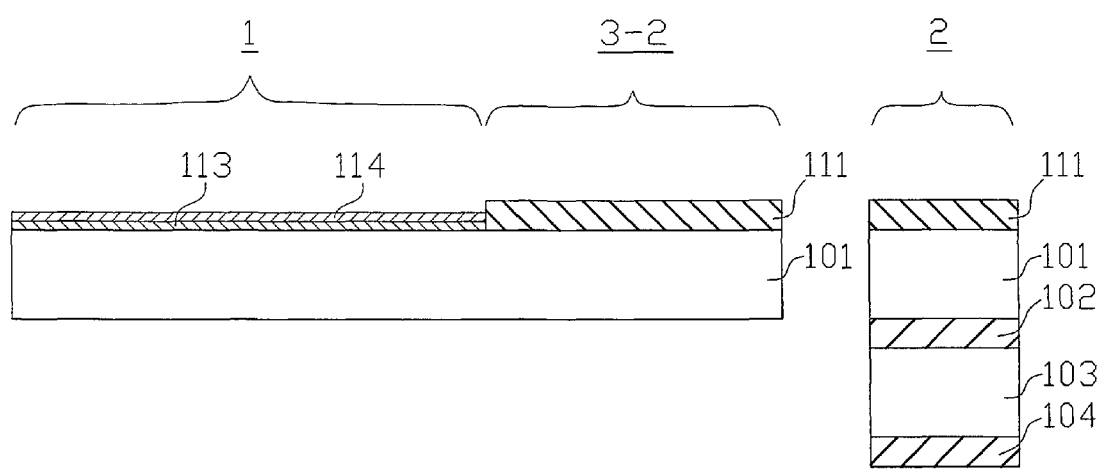
FIG. 3 is a cross-sectional view of the optical deflector taken along the line in FIG. 2.

As illustrated in FIG. 3, the circular mirror 1 is constructed by the silicon "Device" layer 101, the Ti contact layer 113 and the Ag or Au reflective layer 114.

As illustrated in FIG. 3, the rectangular support frame 2 is constructed by the silicon "Device" layer 101, the silicon dioxide "Box" layer 102, the silicon "Handle" layer 103 and the silicon dioxide layers 104 and 111.

As illustrated in FIG. 3, the torsion bar 3-2 as well as the torsion bar 3-1 are constructed by the silicon "Device" layer 101 and the silicon dioxide layer 111.

Figure 6:
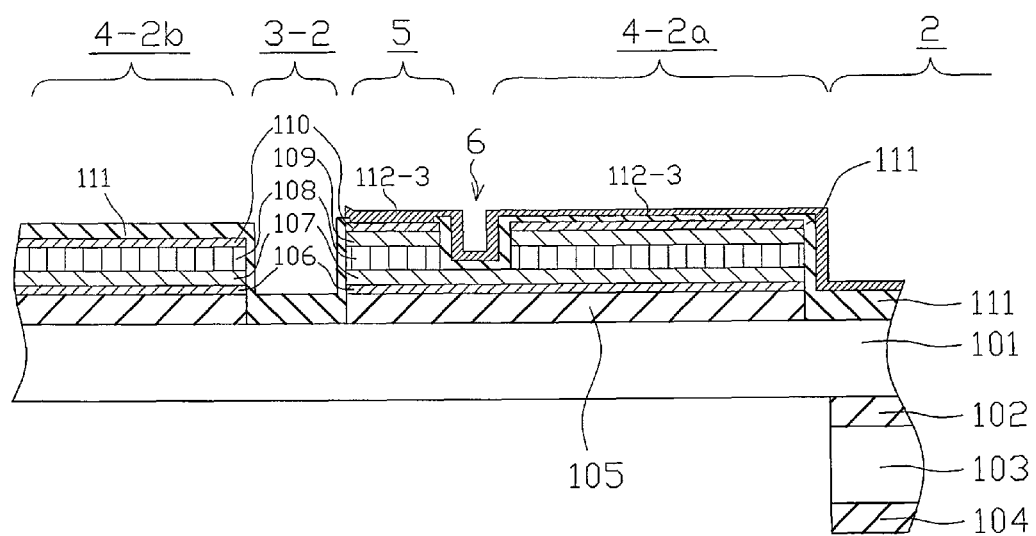
FIG. 6 is a cross-sectional view of the optical deflector taken along the line VI-VI in FIG. 2.

As illustrated in FIGS. 4 and 6, the linear piezoelectric actuator 4-2a as well as the linear piezoelectric actuators 4-1a, 4-1b and 4-2b are constructed by the silicon "Device" layer 101, the silicon dioxide layer 105, the Ti contact layer 106, the Pt lower electrode layer 107, the PZT piezoelectric layer 108, the Pt upper electrode layer 109, the Ti contact layer 110 and the silicon dioxide layer 111. Note that the conductive layers 112-1, 112-2, 112-3, 112-4 and 112-5 are not connected to the Pt upper electrode layer 109 of the linear piezoelectric actuator 4-2a.

As illustrated in FIGS. 5 and 6, the piezoelectric sensor 5 is constructed by the silicon "Device" layer 101, the silicon dioxide layer 105, the Ti contact layer 106, the Pt lower electrode layer 107, the PZT piezoelectric layer 108, the Pt upper electrode layer 109, the Ti contact layer 110, the silicon dioxide layer 111 and the conductive layers 112-1, 112-2, 112-3, 112-4 and 112-5.

Also, in FIG. 6, the groove 6 is formed between the linear piezoelectric actuator 4-2a and the piezoelectric sensor 5, so that the PZT piezoelectric layer 108, the Pt upper electrode layer 109 and the Ti contact layer 110 of the linear piezoelectric actuator 4-2a are electrically separated from those of the piezoelectric sensor 5. However, the conductive layers 112-1, 112-2, 112-3, 112-4 and 112-5 are present in the groove 6.

Figure 7:
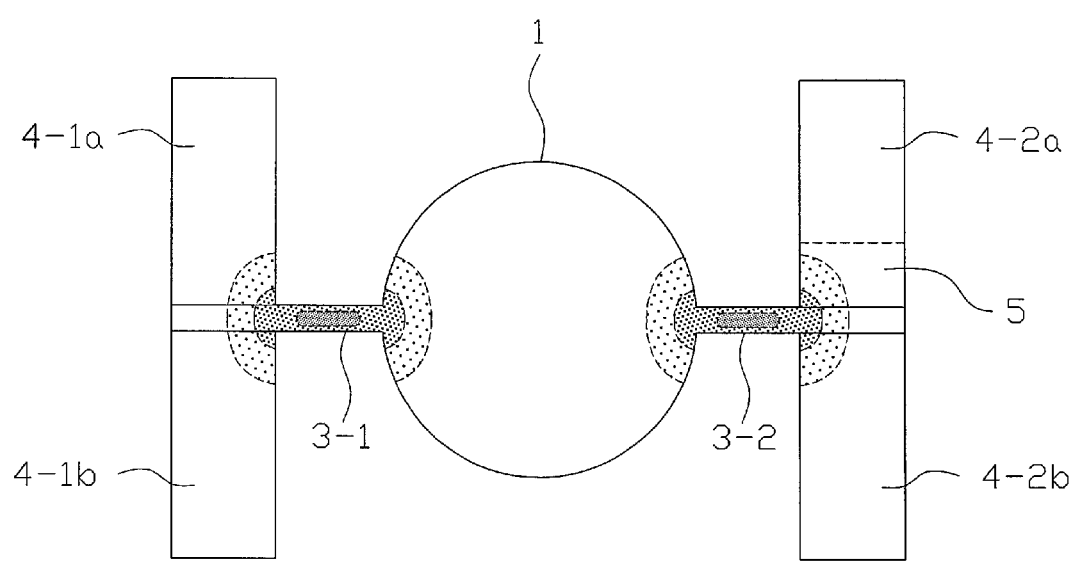
FIG. 7 is a diagram illustrating a simulated stress distribution in the optical deflector of FIG. 1.

When a simulation using the Oofelie-Multiphysics V4.4 (trademark) simulation software provided by Open Engineering was performed upon the one-dimensional optical deflector 10A of FIG. 1, a stress distribution as illustrated in FIG. 7 was obtained in the one-dimensional optical deflector 10A of FIG. 1. In FIG. 7, the stronger stress, whether it is a compression stress or a tension stress, is shown as darker in the illustration. That is, the strong stress was concentrated at an inner-side portion of the piezoelectric sensor 5 in the vicinity of the torsion bar 3-2. Therefore, the piezoelectric sensor elements 5-1 and 5-2 than the piezoelectric sensor element 5-3, 5-4 and 5-5 are susceptible to the stress generated in the one-dimensional optical deflector 10A of FIG. 1.

Figure 8A:
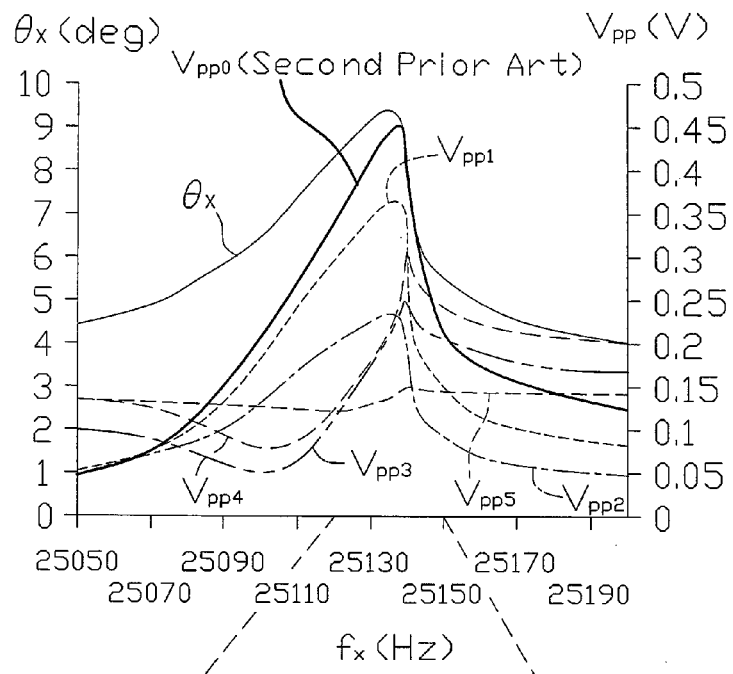
FIG. 8A is a graph showing the relationship between the frequency of sinusoidal-wave drive voltages and the deflection angle of the circular mirror of FIG. 1 and the relationship between the frequency of sinusoidal-wave drive voltages and the peak-to-peak voltages of the sense voltages of the piezoelectric sensor elements of the piezoelectric sensor of FIG. 1.
Figure 8B:
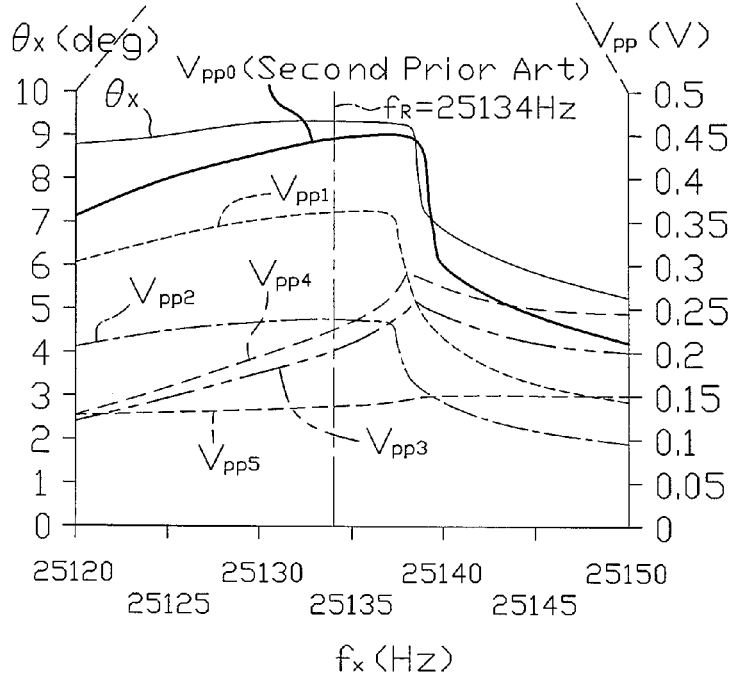
FIG. 8B is a partial enlargement of FIG. 8A.

FIG. 8A depicts a graph showing the relationship between the frequency $f_x$ of the sinusoidal-wave drive voltages $V_{Xa}$ and $V_{Xb}$ and the deflection angle $\theta_x$ of the circular mirror 1 of FIG. 1 and the relationship between the frequency $f_x$ and the peak-to-peak voltages $V_{pp1}$, $V_{pp2}$, $V_{pp3}$, $V_{pp4}$ and $V_{pp5}$ of the sense voltages of the piezoelectric sensor elements 5-1, 5-2, 5-3, 5-4 and 5-5 where the piezoelectric sensor elements 5-1, 5-2, 5-3, 5-4 and 5-5 are separated from each other, i.e., the conductive layers 112-2, 112-3, 112-4 and 112-5 are not connected to the pad $P_{GND}$. Also, FIG. 8B is a partial enlargement of FIG. 8A. The sense voltages at the conductive layers 112-1, 112-2, 112-3, 112-4 and 112-5 are derived by using probes, so that the peak-to-peak voltages $V_{pp}$ thereof can be calculated.

Note that the deflection angle $\theta_x$ can be detected by using a one-dimensional position sensitive detector (PSD) which detects a center of the spotlight L reflected from the circular mirror 1. The one-dimensional PSD is connected to the control circuit 30; however, the one-dimensional PSD is removed in a usual operation mode.

As shown in FIGS. 8A and 8B, when the frequency $f_x$ of the sinusoidal-wave drive voltages $V_{Xa}$ and $V_{Xb}$ is 25134 Hz, the deflection angle $\theta_x$ of the circular mirror 1 is maximum. Therefore, 25134 Hz is a resonant frequency $f_R$, i.e., $f_R$=25134 Hz.

Also, as shown in FIGS. 8A and 8B, when the frequency $f_x$ of the sinusoidal-wave drive voltages $V_{Xa}$ and $V_{Xb}$ is 25134 Hz (=$f_R$), the peak-to-peak voltage $V_{pp1}$ of the sense voltage of the piezoelectric sensor element 5-1 is maximum, i.e., 0.356V. In this case, the noise level at a frequency 20032 Hz of the sinusoidal-wave drive voltages $V_{Xa}$ and $V_{Xb}$ is 0.0374V, and therefore, the signal-to-noise (S/N) ratio is 9.5 (=0.356/0.0374) which is sufficiently high. Therefore, when the frequency $f_x$ of the sinusoidal-wave drive voltages $V_{Xa}$ and $V_{Xb}$ is controlled by the feedback of the peak-to-peak voltage $V_{pp1}$ of the sense voltage of the piezoelectric sensor element 5-1 thereto, so that the peak-to-peak voltage $V_{pp1}$ is brought close to its maximum value 0.356V, a resonant state ($f_x$=$f_R$) can be realized.

Further, as shown in FIGS. 8A and 8B, when the frequency $f_x$ of the sinusoidal-wave drive voltages $V_{Xa}$ and $V_{Xb}$ is 25134 Hz (=$f_R$), the peak-to-peak voltage $V_{pp2}$ of the sense voltage of the piezoelectric sensor element 5-2 is maximum, i.e., 0.235V. In this case, the S/N ratio is a little low. However, when the frequency $f_x$ of the sinusoidal-wave drive voltages $V_{Xa}$ and $V_{Xb}$ is controlled by the feedback of the peak-to-peak voltage $V_{pp2}$ of the sense voltage of the piezoelectric sensor element 5-2 thereto, so that the peak-to-peak voltage $V_{pp2}$ is brought close to its maximum value 0.235V, a resonant state ($f_x$=$f_R$) can be realized.

On the other hand, as shown in FIGS. 8A and 8B, when the frequency $f_x$ of the sinusoidal-wave drive voltages $V_{Xa}$ and $V_{Xb}$ is 25138 Hz ($>f_R$), the peak-to-peak voltage $V_{pp3}$ of the sense voltage of the piezoelectric sensor element 5-3 is maximum, i.e., 0.250V. Therefore, even when the frequency $f_x$ of the sinusoidal-wave drive voltages $V_{Xa}$ and $V_{Xb}$ is controlled by the feedback of the peak-to-peak voltage $V_{pp3}$ of the sense voltage of the piezoelectric sensor element 5-3 thereto, so that the peak-to-peak voltage $V_{pp3}$ is brought close to its maximum value 0.250V, a resonant state ($f_x=f_R$) cannot be realized.

Also, as shown in FIGS. 8A and 8B, when the frequency $f_x$ of the sinusoidal-wave drive voltages $V_{Xa}$ and $V_{Xb}$ is 25138 Hz ($>f_R$), the peak-to-peak voltage $V_{pp4}$ of the sense voltage of the piezoelectric sensor element 5-4 is maximum, i.e., 0.270V. Therefore, even when the frequency $f_x$ of the sinusoidal-wave drive voltages $V_{Xa}$ and $V_{Xb}$ is controlled by the feedback of the peak-to-peak voltage $V_{pp4}$ of the sense voltage of the piezoelectric sensor element 5-4 thereto, so that the peak-to-peak voltage $V_{pp4}$ is brought close to its maximum value 0.270V, a resonant state ($f_x=f_R$) cannot be realized.

Further, as shown in FIGS. 8A and 8B, when the frequency $f_x$ of the sinusoidal-wave drive voltages $V_{Xa}$ and $V_{Xb}$ is 25140 Hz ($>f_R$), the peak-to-peak voltage $V_{pp5}$ of the sense voltage of the piezoelectric sensor element 5-5 is maximum, i.e., 0.141V. Therefore, even when the frequency $f_x$ of the sinusoidal-wave drive voltages $V_{Xa}$ and $V_{Xb}$ is controlled by the feedback of the peak-to-peak voltage $V_{pp5}$ of the sense voltage of the piezoelectric sensor element 5-5 thereto, so that the peak-to-peak voltage $V_{pp5}$ is brought close to its maximum value 0.141V, a resonant state ($f_x=f_R$) cannot be realized.

If the piezoelectric sensor elements 5-1, 5-2, 5-3, 5-4 and 5-5 are combined into a single piezoelectric sensor which is expected to generate a sense voltage with a peak-to-peak voltage $V_{pp0}$ as shown in FIGS. 8A and 8B. Note that the peak-to-peak voltage $V_{pp0}$ would be generated in the above-mentioned second prior art one-dimensional piezoelectric actuator. When the frequency $f_x$ of the sinusoidal-wave drive voltages $V_{Xa}$ and $V_{Xb}$ is 25137 Hz ($>f_R$), the peak-to-peak voltage $V_{pp0}$ is maximum, i.e., 0.450V. Therefore, even when the frequency $f_x$ of the sinusoidal-wave drive voltages $V_{Xa}$ and $V_{Xb}$ is controlled by the feedback of the peak-to-peak voltage $V_{pp0}$ of the sense voltage of the single piezoelectric sensor thereto, so that the peak-to-peak voltage $V_{pp0}$ is brought close to its maximum value 0.450V, resonant state cannot be realized.

As explained above, a resonant state can be realized by the peak-to-peak voltage $V_{pp2}$ of the sense voltage of the piezoelectric sensor element 5-2. In this case, as illustrated in FIG. 9, the conductive layer 112-2 is connected to the pad $P_{XS}$, while the conductive layers 112-1, 112-3, 112-4 and 112-5 are connected to the pad $P_{GND}$. Therefore, the piezoelectric sensor element 5-2 can be electrostatically shielded by the piezoelectric sensor elements 5-1 and 5-3 whose Pt upper electrode layers are grounded, thus improving the crosstalk characteristics.

Figure 11:
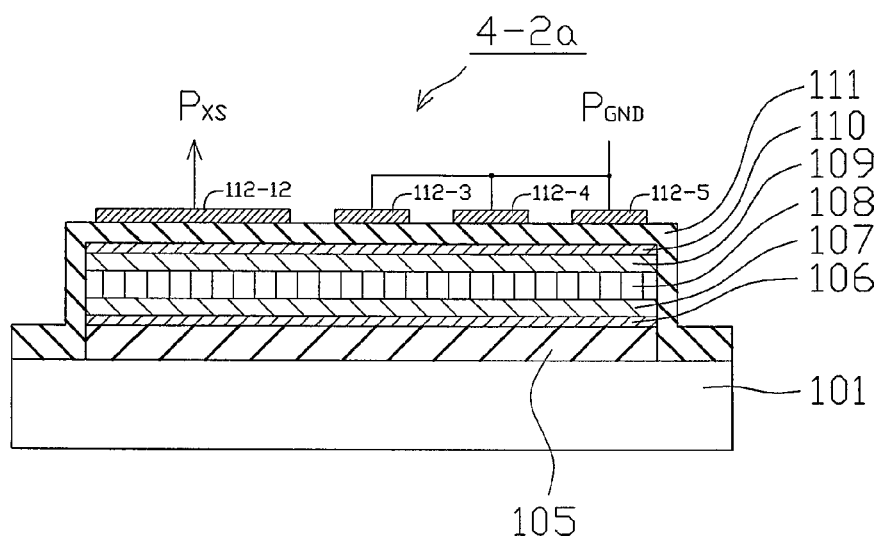
FIG. 11 is a cross-sectional view illustrating a further modification of FIG. 4.

Also, a resonant state can be realized by both of the peak-to-peak voltages $V_{pp1}$ and $V_{pp2}$ of the sense voltages of the piezoelectric sensor elements 5-1 and 5-2. In this case, as illustrated in FIG. 10, the conductive layers 112-1 and 112-2 are connected to the pad $P_{XS}$, while the conductive layers 112-3, 112-4 and 112-5 are connected to the pad $P_{GND}$. However, as illustrated in FIGS. 11 and 12, the piezoelectric sensor elements 5-1 and 5-2 can be combined into a single piezoelectric sensor element 5-12 with a single conductive layer 112-12.

Figure 13:
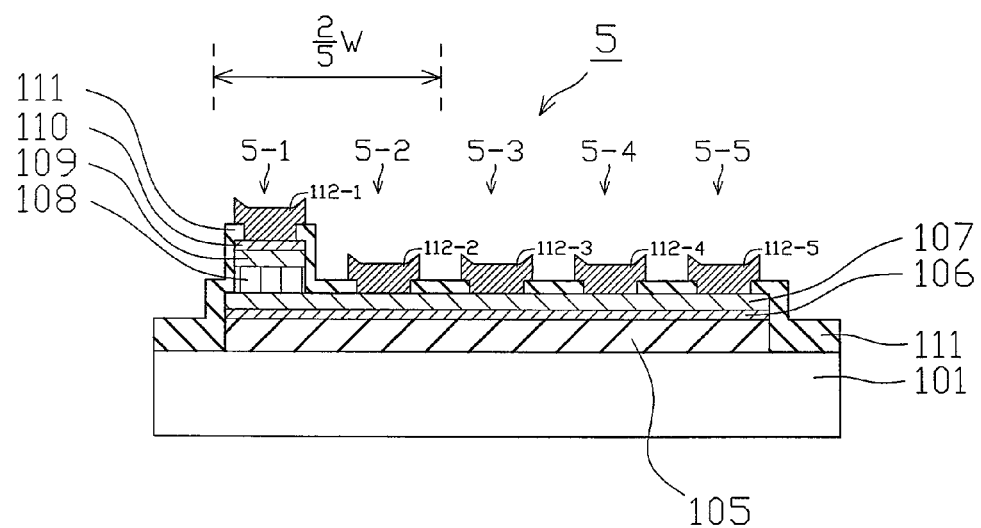
FIG. 13 is a cross-sectional view illustrating another modification of FIG. 5.

In FIG. 13, which illustrates another modification of FIG. 5, the PZT piezoelectric layer 108, the Pt upper electrode layer 109 and the Ti contact layer 110 are removed from the piezoelectric sensor elements 5-2, 5-3, 5-4 and 5-5 of FIG. 5, to simplify the structure of the one-dimensional optical deflector 10A of FIG. 1.

Figure 12:
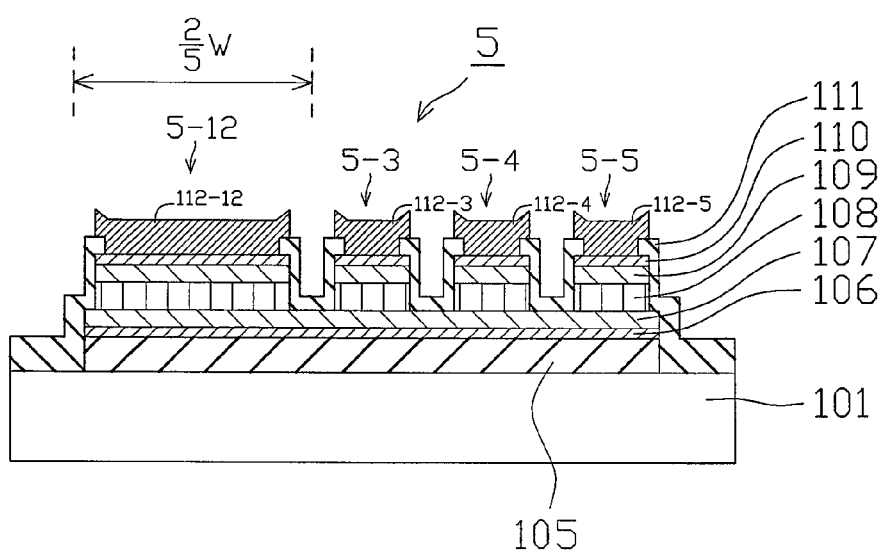
FIG. 12 is a cross-sectional view illustrating a modification of FIG. 5.

As illustrated in FIGS. 5, 12 and 13, the piezoelectric sensor elements 5-1 and/or 5-2, and 5-12 connected to the pad $P_{XS}$ have a width smaller than two-fifths (2/5) of the width W of the piezoelectric actuator 4-2a, and are arranged at a wide portion within two-fifths (2/5) of the width W from the inner end of the linear piezoelectric actuator 4-2a.

Figure 14:
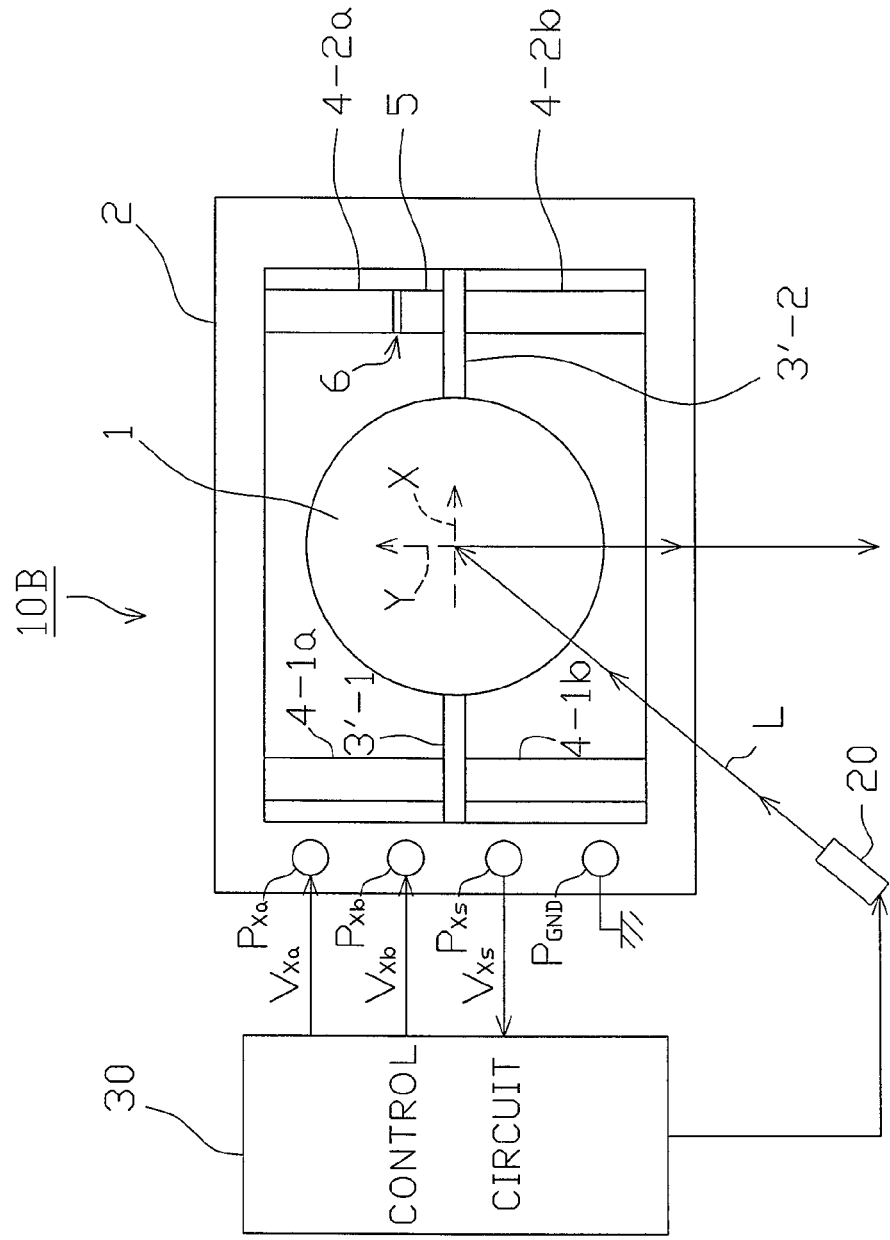
FIG. 14 is a plan view illustrating a second embodiment of the optical deflector according to the presently disclosed subject matter.

In FIG. 14, which illustrates a second embodiment of the optical deflector according to the presently disclosed subject matter, a one-dimensional optical deflector 10B includes torsion bars 3'-1 and 3'-2 instead of the torsion bars 3-1 and 3-2 of FIG. 1. The torsion bars 3'-1 and 3'-2 are coupled between the outer circumference of the circular mirror 1 and the inner end of the rectangular support frame 2. Since the circular mirror 1 is supported by a six-point support at the rectangular support frame 2, the support of the circular mirror 1 is more stable in the optical deflector 10B of FIG. 14 than in the optical deflector 10A of FIG. 1.

Figure 15:
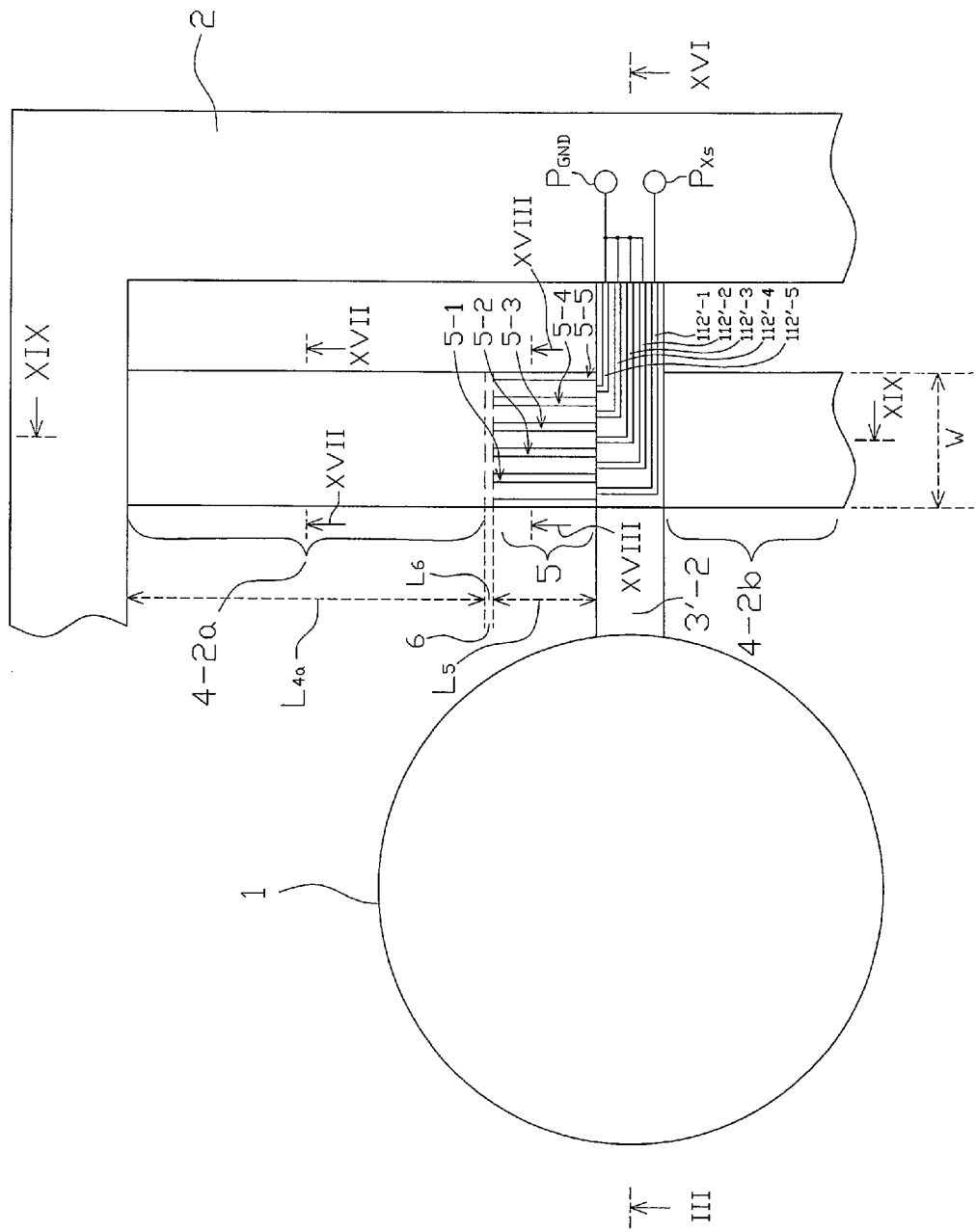
FIG. 15 is a partial enlargement of the optical deflector of FIG. 14.

In FIG. 15, which is a partial enlargement of the one-dimensional optical deflector 10B of FIG. 14, the piezoelectric sensor element 5-1 is connected via a conductive layer 112'-1 over the torsion bar 3'-2 to the pad $P_{XS}$ on the rectangular support frame 2, while the piezoelectric sensor elements 5-2, 5-3, 5-4 and 5-5 are connected via conductive layers 112'-2, 112'-3, 112'-4 and 112'-5 over the torsion bar 3'-2 to the pad $P_{GND}$ on the rectangular support frame 2. In other words, the Pt upper electrode layers of the piezoelectric sensor elements 5-2, 5-3, 5-4 and 5-5 are grounded, so that the piezoelectric sensor elements 5-2, 5-3, 5-4 and 5-5 are inactivated.

FIGS. 16, 17, 18 and 19 are cross-sectional views of the optical deflector of FIG. 15 taken along the line XVI-XVI, the line XVII-XVII, the line XVIII-XVIII and the line XIX-XIX, respectively, in FIG. 15.

Figure 16:
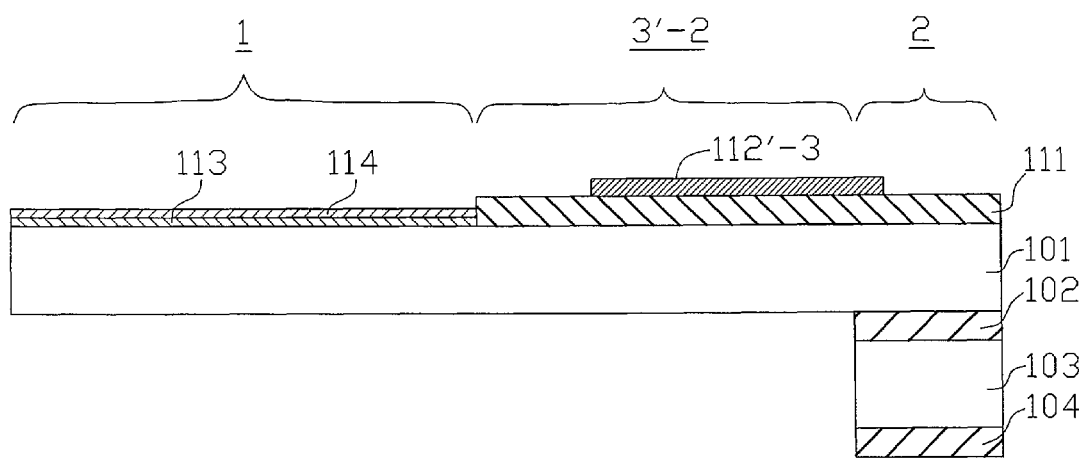
FIG. 16 is a cross-sectional view of the optical deflector taken along the line XVI-XVI in FIG. 15.

As illustrated in FIGS. 15 and 16, the conductive layers 112'-1, 112'-2, 112'-3, 112'-4 and 112'-5 extend over the torsion bar 3'-2 to the rectangular support frame 2. Therefore, since the conductive layers 112'-1, 112'-2, 112'-3, 112'-4 and 112'-5 are not provided on the linear piezoelectric actuator 4-2a which would generate noise relating to the crosstalk, the piezoelectric sensor 5 is hardly subject to the crosstalk.

Figure 17:
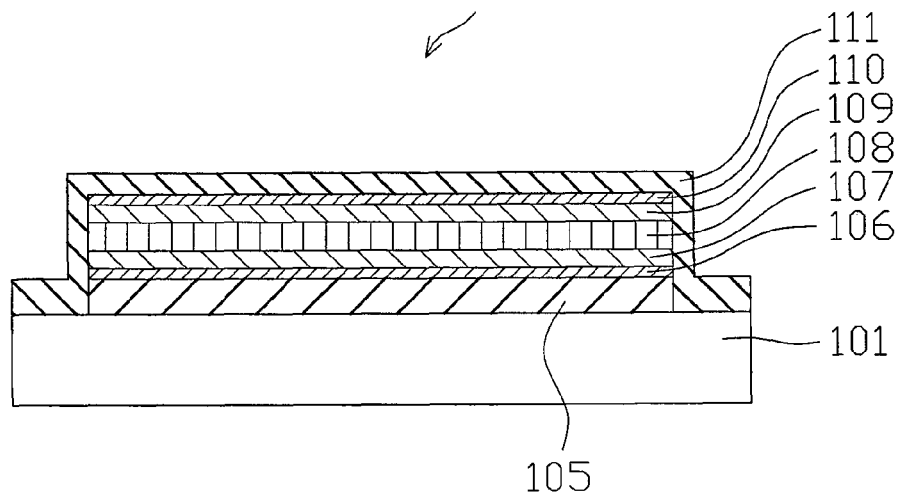
FIG. 17 is a cross-sectional view of the optical deflector taken along the line XVII-XVII in FIG. 15.

As illustrated in FIGS. 15 and 17, the conductive layers 112'-1, 112'-2, 112'-3, 112'-4 and 112'-5 are provided on the linear piezoelectric actuator 4-2a.

Figure 18:
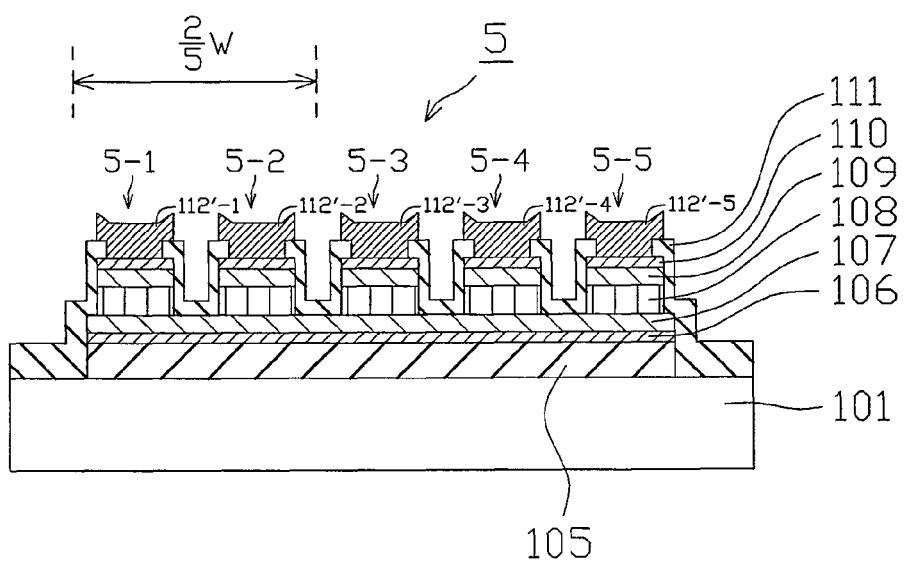
FIG. 18 is a cross-sectional view of the optical deflector taken along the line XVIII-XVIII in FIG. 15.

As illustrated in FIG. 18, the piezoelectric sensor 5 including the piezoelectric sensor elements 5-1, 5-2, 5-3, 5-4 and 5-5 is the same as that as illustrated in FIG. 5.

Figure 19:
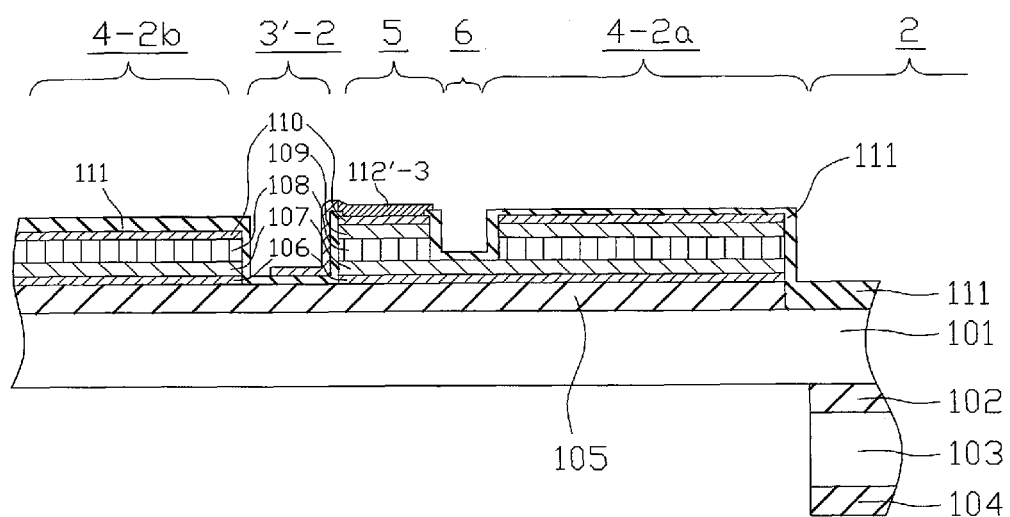
FIG. 19 is a cross-sectional view of the optical deflector taken along the line XIX-XIX in FIG. 15.

As illustrated in FIG. 19, the conductive layer 112'-3 extends from the piezoelectric sensor 5 to the torsion bar 3'-2.

Figure 20:
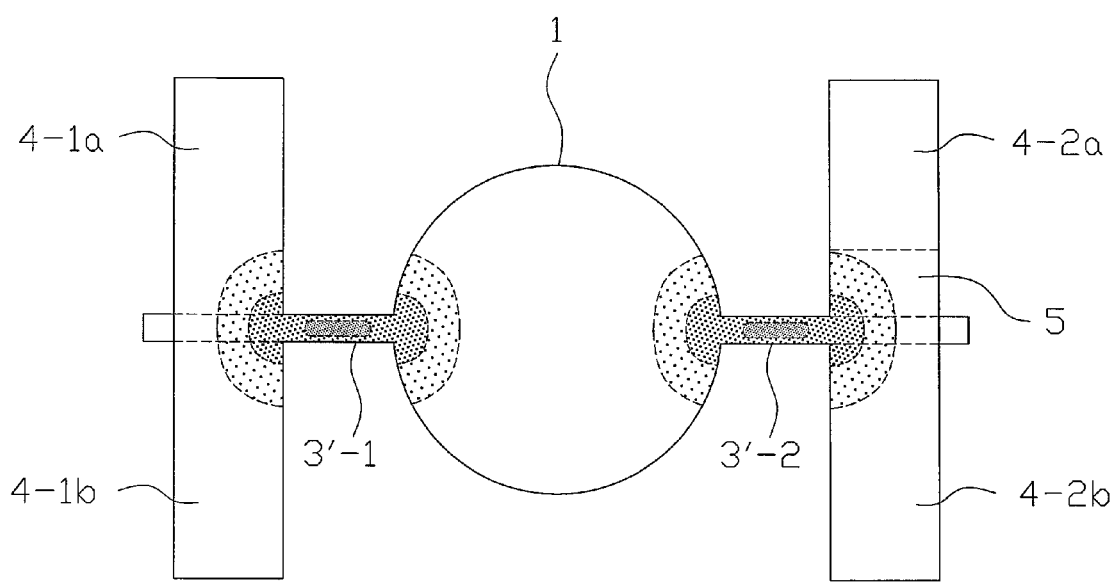
FIG. 20 is a diagram illustrating a simulated stress distribution in the optical deflector of FIG. 14.

When a simulation using Oofelie-Multiphysics V4.4 (trademark) simulation software provided by Open Engineering was performed upon the one-dimensional optical deflector 10B of FIG. 14, a stress distribution as illustrated in FIG. 20 was obtained in the one-dimensional optical deflector 10B of FIG. 14. In FIG. 20, the stronger stress, whether it is a compression stress or a tension stress, is shown as darker in the illustration. That is, the stress distribution of FIG. 20 is a little broader than that of FIG. 7. Even in this case, the piezoelectric sensor elements 5-1 and 5-2 more than the piezoelectric sensor element 5-3, 5-4 and 5-5 are susceptible to the stress generated in the one-dimensional optical deflector 10B of FIG. 14.

Figure 21:
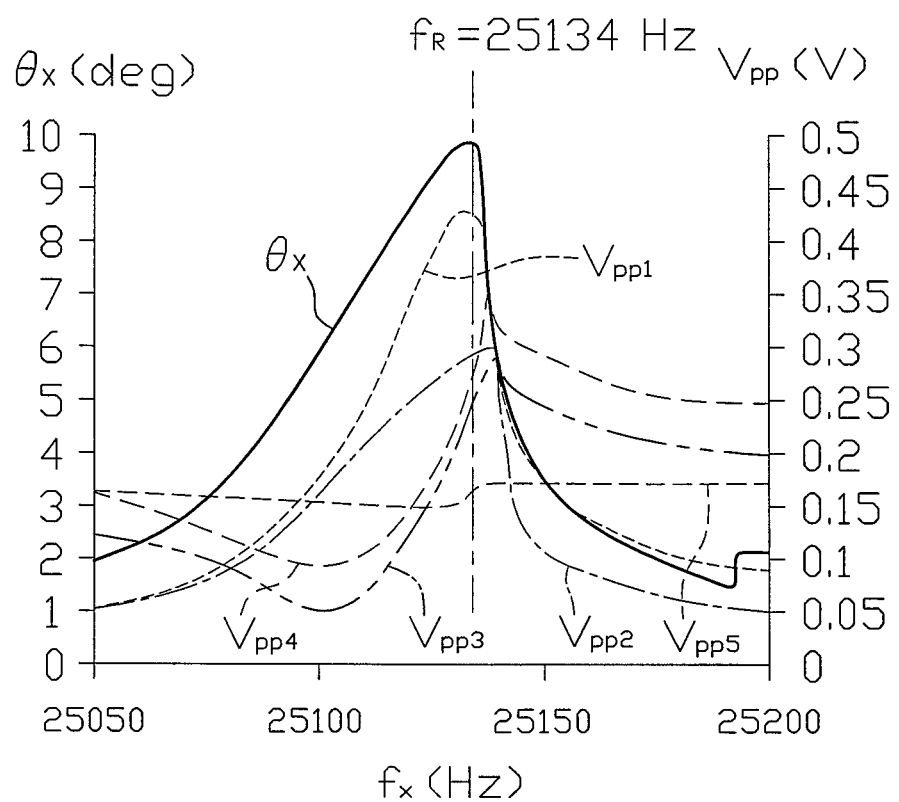
FIG. 21 is a graph showing the relationship between the frequency of sinusoidal-wave drive voltages and the deflection angle of the circular mirror of FIG. 14 and the relationship between the frequency of sinusoidal-wave drive voltages and the peak-to-peak voltages of the sense voltages of the piezoelectric sensor elements of the piezoelectric sensor of FIG. 14.

FIG. 21 depicts a graph showing the relationship between the frequency $f_x$ of the sinusoidal-wave drive voltages $V_{Xa}$ and $V_{Xb}$ and the deflection angle $\theta_x$ of the circular mirror 1 of FIG.

14 and the relationship between the frequency $f_x$ and the peak-to-peak voltages $V_{pp1}$, $V_{pp2}$, $V_{pp3}$, $V_{pp4}$ and $V_{pp5}$ of the sense voltages of the piezoelectric sensor elements 5-1, 5-2, 5-3, 5-4 and 5-5 where the piezoelectric sensor elements 5-1, 5-2, 5-3, 5-4 and 5-5 are separated from each other, i.e., the conductive layers 112'-2, 112'-3, 112'-4 and 112'-5 are not connected to the pad $P_{GND}$. The sense voltages at the conductive layers 11'2-1, 112'-2, 112'-3, 112'-4 and 112'-5 are derived by using probes, so that the peak-to-peak voltages $V_{pp}$ thereof can be calculated.

As shown in FIG. 21, when the frequency $f_x$ of the sinusoidal-wave drive voltages $V_{Xa}$ and $V_{Xb}$ is 25134 Hz, the deflection angle $\theta_x$ of the circular mirror 1 is maximum. Therefore, 25134 Hz is a resonant frequency $f_R$, i.e., $f_R$=25134 Hz.

Also, as shown in FIG. 21, when the frequency $f_x$ of the sinusoidal-wave drive voltages $V_{Xa}$ and $V_{Xb}$ is 25134 Hz (=$f_R$), the peak-to-peak voltage $V_{pp1}$ of the sense voltage of the piezoelectric sensor element 5-1 is maximum, i.e., 0.427V. In this case, the noise level at a frequency 20032 Hz is 0.0440V, and therefore, the S/N ratio is 9.7 (=0.427/0.0440) which is higher than the S/N ratio 9.5 in the optical deflector 10A of FIG. 2. This is because the conductive layers 112'-1, 112'2, 112'-3, 112'-4 and 112'-5 are shorter than the conductive layers 112-1, 112-2, 112-3, 112-4 and 112-5 of FIG. 2 and the stress distribution of FIG. 20 is broader than that of FIG. 7 due to the six-point support of the circular mirror 1. Therefore, when the frequency $f_x$ of the sinusoidal-wave drive voltages $V_{Xa}$ and $V_{Xb}$ is controlled by the feedback of the peak-to-peak voltage $V_{pp1}$ of the sense voltage of the piezoelectric sensor element 5-1 thereto, so that the peak-to-peak voltage $V_{pp1}$ is brought close to its maximum value 0.427V, a resonant state ($f_x$=$f_R$) can be realized.

Other peak-to-peak voltages $V_{pp2}$, $V_{pp3}$, $V_{pp4}$ and $V_{pp5}$ of FIG. 21 are similar to those of FIG. 8A and FIG. 8B; however, the other peak-to-peak voltages $V_{pp2}$, $V_{pp3}$, $V_{pp4}$ and $V_{pp5}$ of FIG. 21 are a little higher than those of FIGS. 8A and 8B.

The modifications as illustrated in FIGS. 9, 10, 11, 12 and 13 can be applied to the optical deflector 10B of FIG. 14.

As illustrated in FIG. 18, the piezoelectric sensor elements 5-1 and/or 5-2, and 5-12 connected to the pad $P_{XS}$ have a width smaller than two-fifths (2/5) of the width W of the piezoelectric actuator 4-2a, and are arranged at a wide portion within two-fifths (2/5) of the width W from the inner end of the linear piezoelectric actuator 4-2a.

In the above-described first and second embodiments, the mirror 1 can be rectangular or square.

Figure 22:
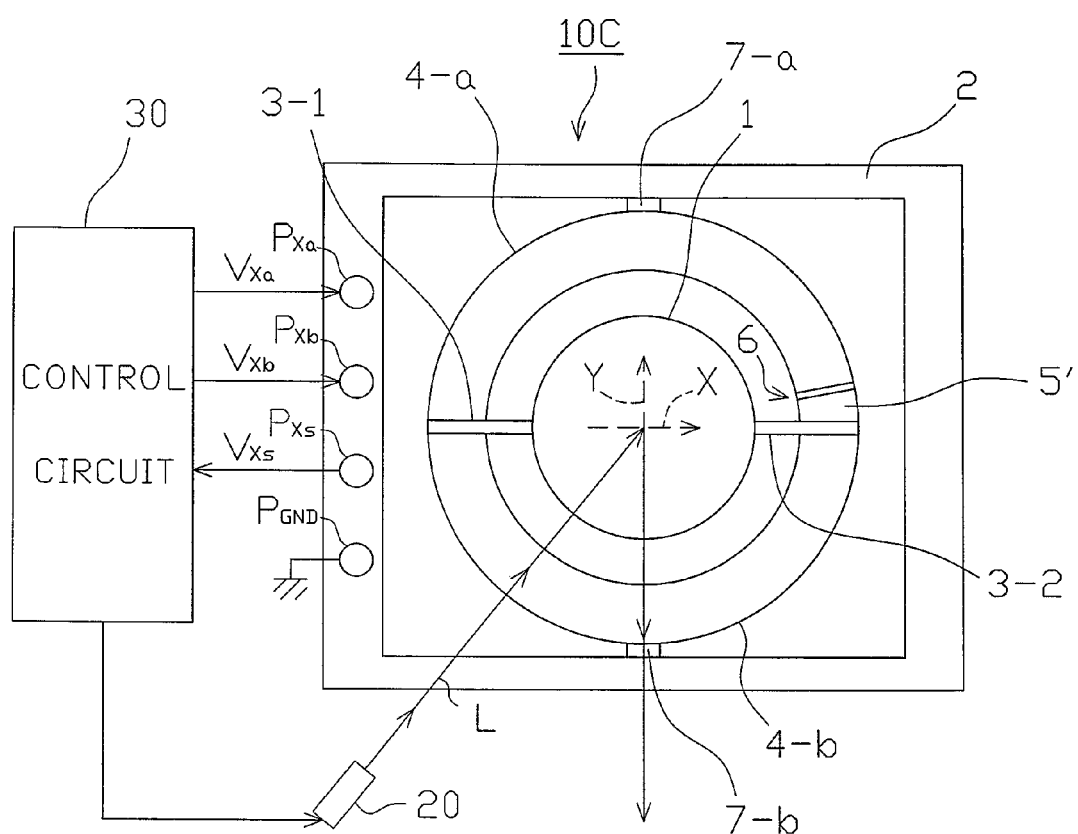
FIG. 22 is a plan view illustrating a third embodiment of the optical deflector according to the presently disclosed subject matter.

In FIG. 22, which illustrates a third embodiment of the optical deflector according to the presently disclosed subject matter, a one-dimensional optical deflector 10C includes a semi-ring-shaped piezoelectric sensor 4-a with a base coupling portion 7-a coupled to the rectangular support frame 2, instead of the linear piezoelectric actuators 4-1a and 4-2a of FIG. 1, and also, includes a semi-ring-shaped piezoelectric sensor 4-b with a base coupling portion 7-b coupled to the rectangular support frame 2, instead of the linear piezoelectric actuators 4-1b and 4-2b of FIG. 1. The base coupling portions 7-a and 7-b alternate with the torsion bars 3-1 and 3-2 at 90 degrees. Also, the one-dimensional optical deflector 10C includes a curved piezoelectric sensor 5' instead of the piezoelectric sensor 5 of FIG. 1.

In FIG. 22, the circular mirror 1 is supported by a two-point support at the rectangular support frame 2.

Figure 23:
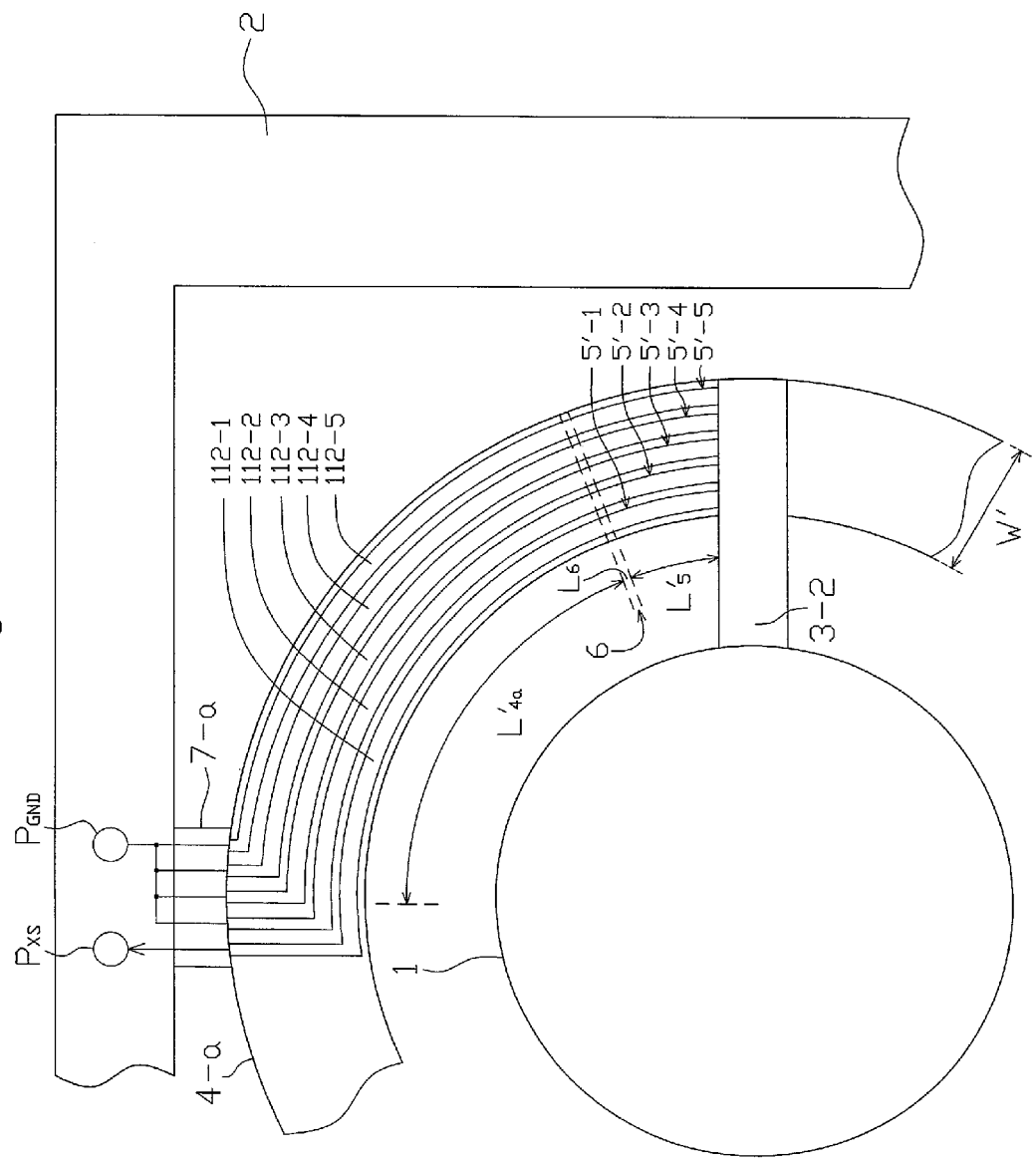
FIG. 23 is a partial enlargement of the optical deflector of FIG. 22.

In FIG. 23, which is a partial enlargement of the one-dimensional optical deflector 10C of FIG. 22, the lengths of the semi-ring-shaped piezoelectric actuator 4-a and the curved piezoelectric sensor 5' along their center lines between the base coupling portion 7-a and the torsion bar 7-2 are defined by $L'_{4a}$ and $L'_5$, respectively. In this case, $$L'_{4a}/6 < L'_5 < L'_{4a}/3$$

When $L'_5 \leq L'_{4a}/6$, the sense voltage $V_{XS}$ of the curved piezoelectric sensor 5' is too small. On the other hand, when $L'_5 \geq L'_{4a}/3$, the drive force of the semi-ring-shaped piezoelectric actuator 4-a is too small.

Also, the width of the semi-ring-shaped piezoelectric actuators 4-a and 4-b and the curved piezoelectric sensor 5' is representatively defined by W'.

The curved piezoelectric sensor 5' is divided into five piezoelectric sensor elements 5'-1, 5'-2, 5'-3, 5'-4 and 5'-5 which are equidistantly arranged along the width direction. That is, the width of each of the piezoelectric sensor elements 5'-1, 5'-2, 5'-3, 5'-4 and 5'-5 is W'/5. The piezoelectric sensor element 5'-1 is connected via a conductive layer 112-1 over the semi-ring-shaped piezoelectric actuator 4-a to the pad $P_{XS}$ on the rectangular support frame 2, while the piezoelectric sensor elements 5'-2, 5'-3, 5'-4 and 5'-5 are connected via conductive layers 112-2, 112-3, 112-4 and 112-5 over the semi-ring-shaped piezoelectric actuator 4-a to the pad $P_{GND}$ on the rectangular support frame 2. In other words, the Pt upper electrode layers of the piezoelectric sensor elements 5'-2, 5'-3, 5'-4 and 5'-5 are grounded, so that the piezoelectric sensor elements 5'-2, 5'-3, 5'-4 and 5'-5 are inactivated.

Note that the conductive layers 112-1, 112-2, 112-3, 112-4 and 112-5 are about the same as those of FIGS. 2, 4, 6, 9, 10, 11, 12 and 13.

Figure 24:
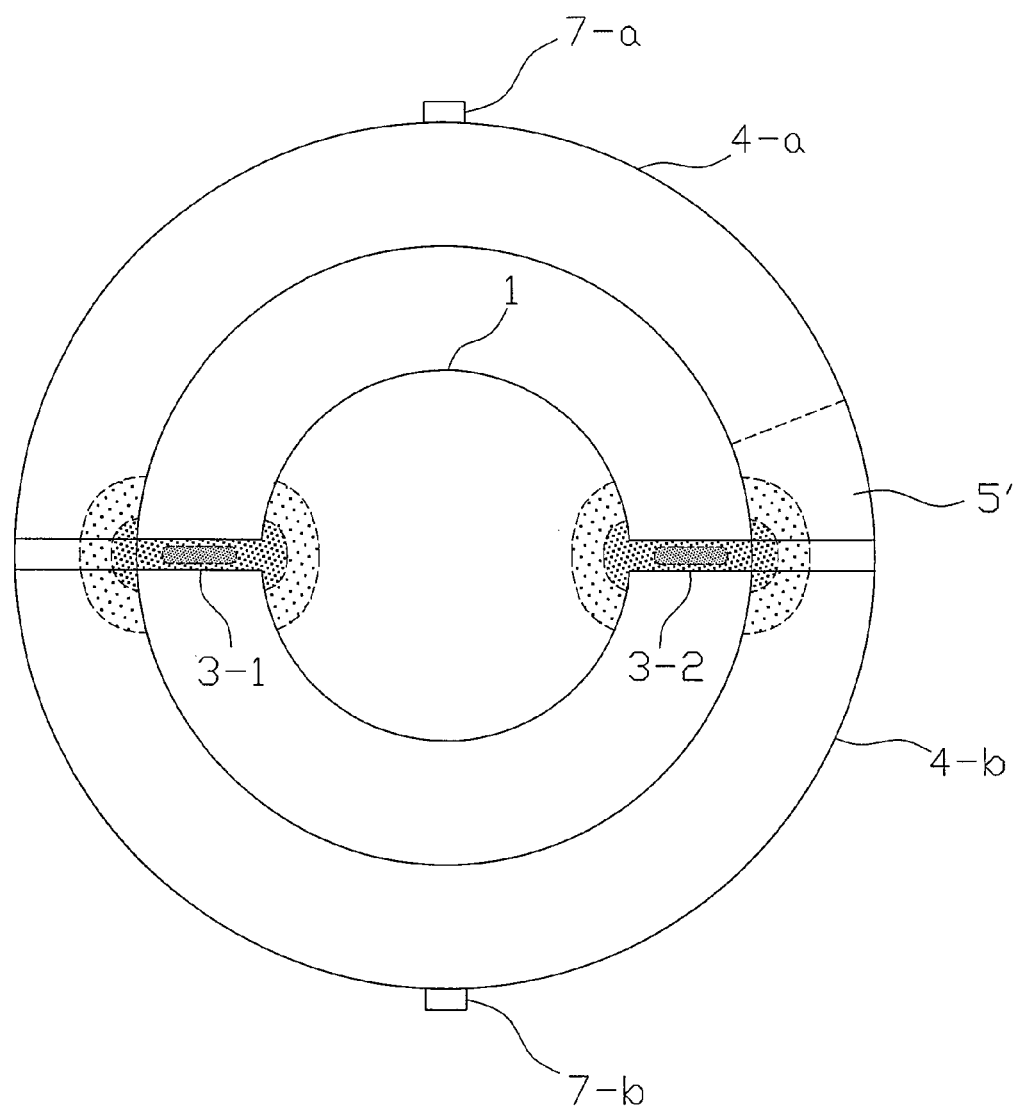
FIG. 24 is a diagram illustrating a simulated stress distribution in the optical deflector of FIG. 22.

When a simulation using the Oofelie-Multiphysics V4.4 (trademark) simulation software provided by Open Engineering was performed upon the one-dimensional optical deflector 10C of FIG. 22, a stress distribution as illustrated in FIG. 24 was obtained in the one-dimensional optical deflector 10C of FIG. 22. In FIG. 24, the stronger stress, whether it is a compression stress or a tension stress, is shown as darker in the illustration. That is, the strong stress was concentrated at an inner-side portion of the curved piezoelectric sensor 5' in the vicinity of the torsion bar 3-2. Therefore, the piezoelectric sensor elements 5'-1 and 5'-2 than the piezoelectric sensor element 5'-3, 5'-4 and 5'-5 are susceptible to the stress generated in the one-dimensional optical deflector 10C of FIG. 22, in the same way as in the first embodiment.

As illustrated in FIG. 23, the piezoelectric sensor elements 5-1 connected to the pad have a width smaller than two-fifths (2/5) of the width W' of the semi-ring-shaped piezoelectric actuator 4-a, and are arranged at a wide portion within two-fifths (2/5) of the width W' from the inner end of the semi-ring-shaped piezoelectric actuator 4-a.

Figure 25:
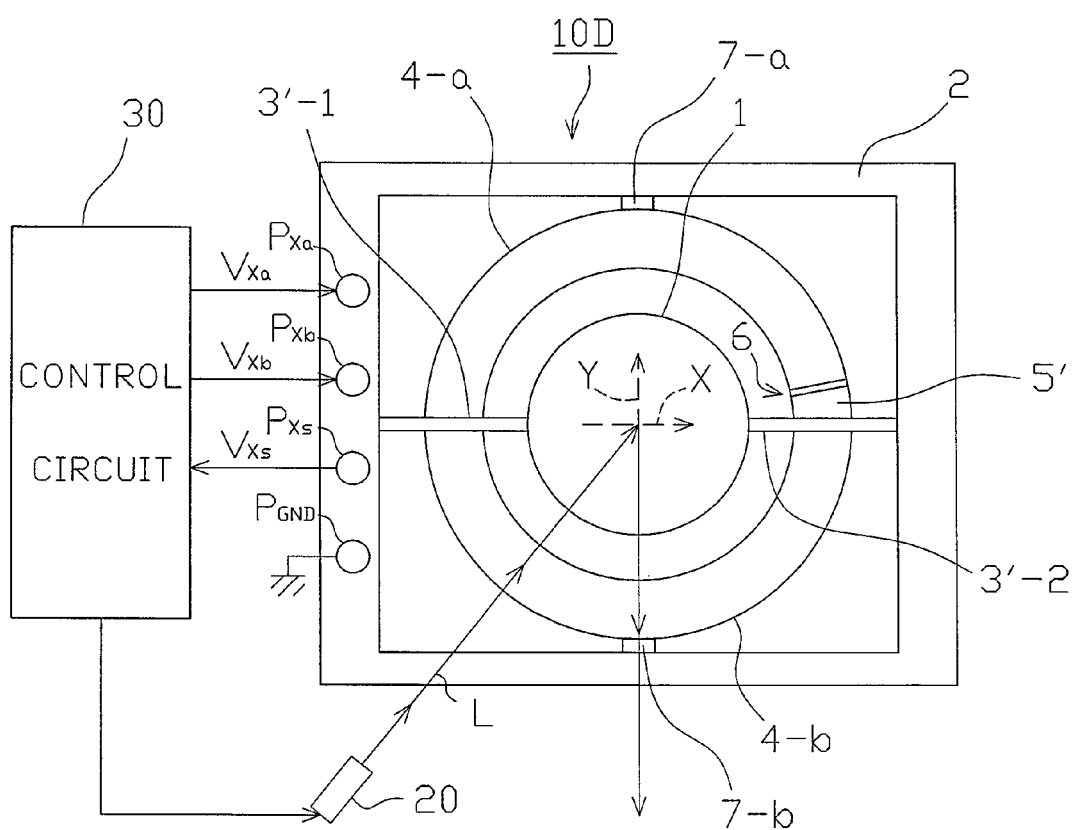
FIG. 25 is a plan view illustrating a fourth embodiment of the optical deflector according to the presently disclosed subject matter.

In FIG. 25, which illustrates a fourth embodiment of the optical deflector according to the presently disclosed subject matter, a one-dimensional optical deflector 10D includes torsion bars 3'-1 and 3'-2 instead of the torsion bars 3-1 and 3-2 of FIG. 22. The torsion bars 3'-1 and 3'-2 are coupled between the outer circumference of the circular mirror 1 and the inner end of the rectangular support frame 2. Since the circular mirror 1 is supported by a four-point support at the rectangular support frame 2, the support of the circular mirror 1 is more stable in the optical deflector 10D of FIG. 25 than the optical deflector 10C of FIG. 22.

Figure 26:
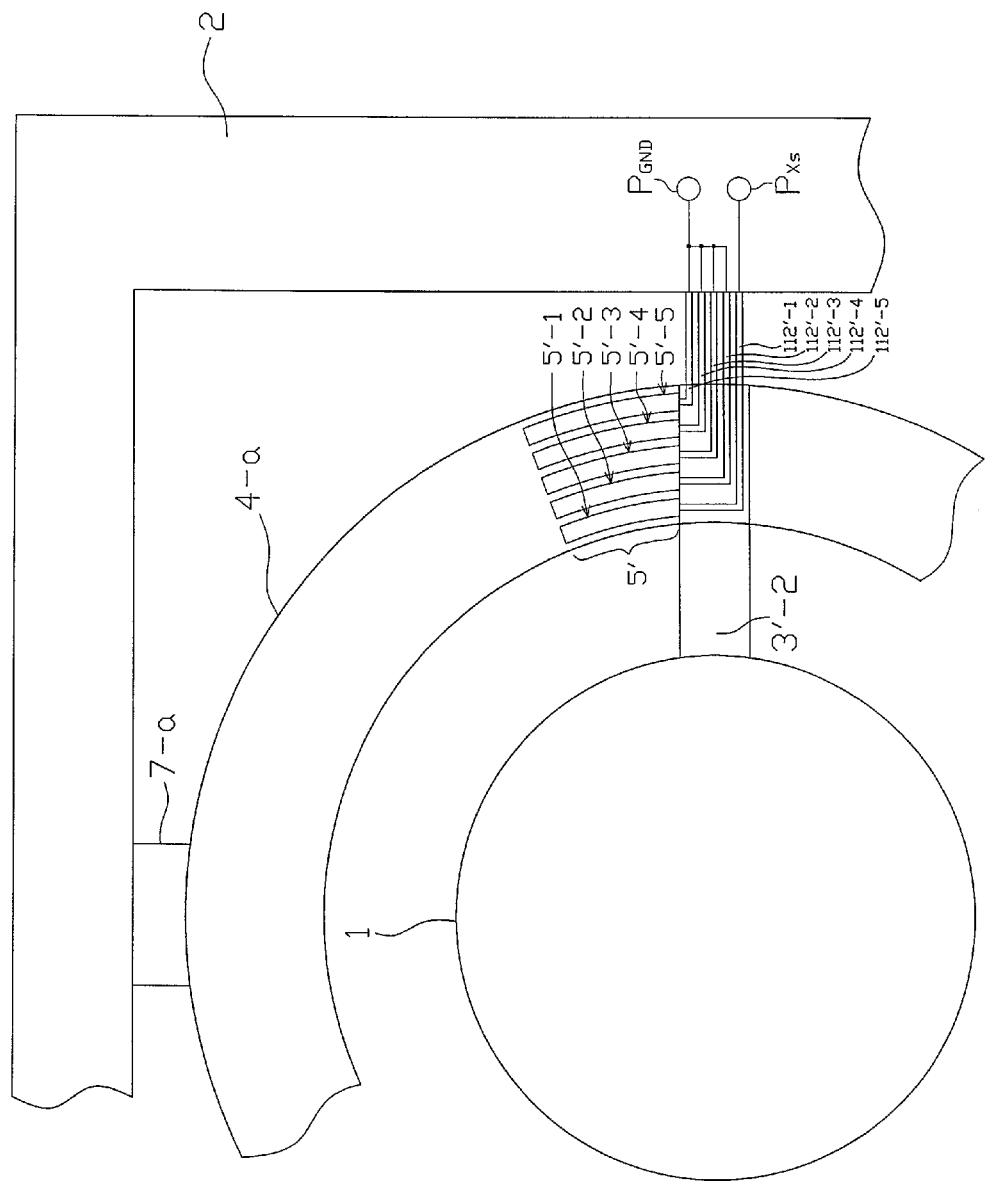
FIG. 26 is a partial enlargement of the optical deflector of FIG. 25.

In FIG. 26, which is a partial enlargement of the one-dimensional optical deflector 10D of FIG. 25, the piezoelectric sensor element 5'-1 is connected via a conductive layer 112'-1 over the torsion bar 3'-2 to the pad $P_{XS}$ on the rectangular support frame 2, while the piezoelectric sensor elements 5'-2, 5'-3, 5'-4 and 5'-5 are connected via conductive layers 112'2, 112'3, 112'-4 and 112'-5 over the torsion bar 3'-2 to the pad P$_{GND}$ on the rectangular support frame 2. In other words, the Pt upper electrode layers of the piezoelectric sensor elements 5'-2, 5'-3, 5'-4 and 5'-5 are grounded, so that the piezoelectric sensor elements 5'-2, 5'-3, 5'-4 and 5'-5 are inactivated.

Note that the conductive layers 112'-1, 112'2, 112'-3, 112'-4 and 112'-5 are about the same as those of FIGS. 15, 16, 17, 18 and 19.

Figure 27:
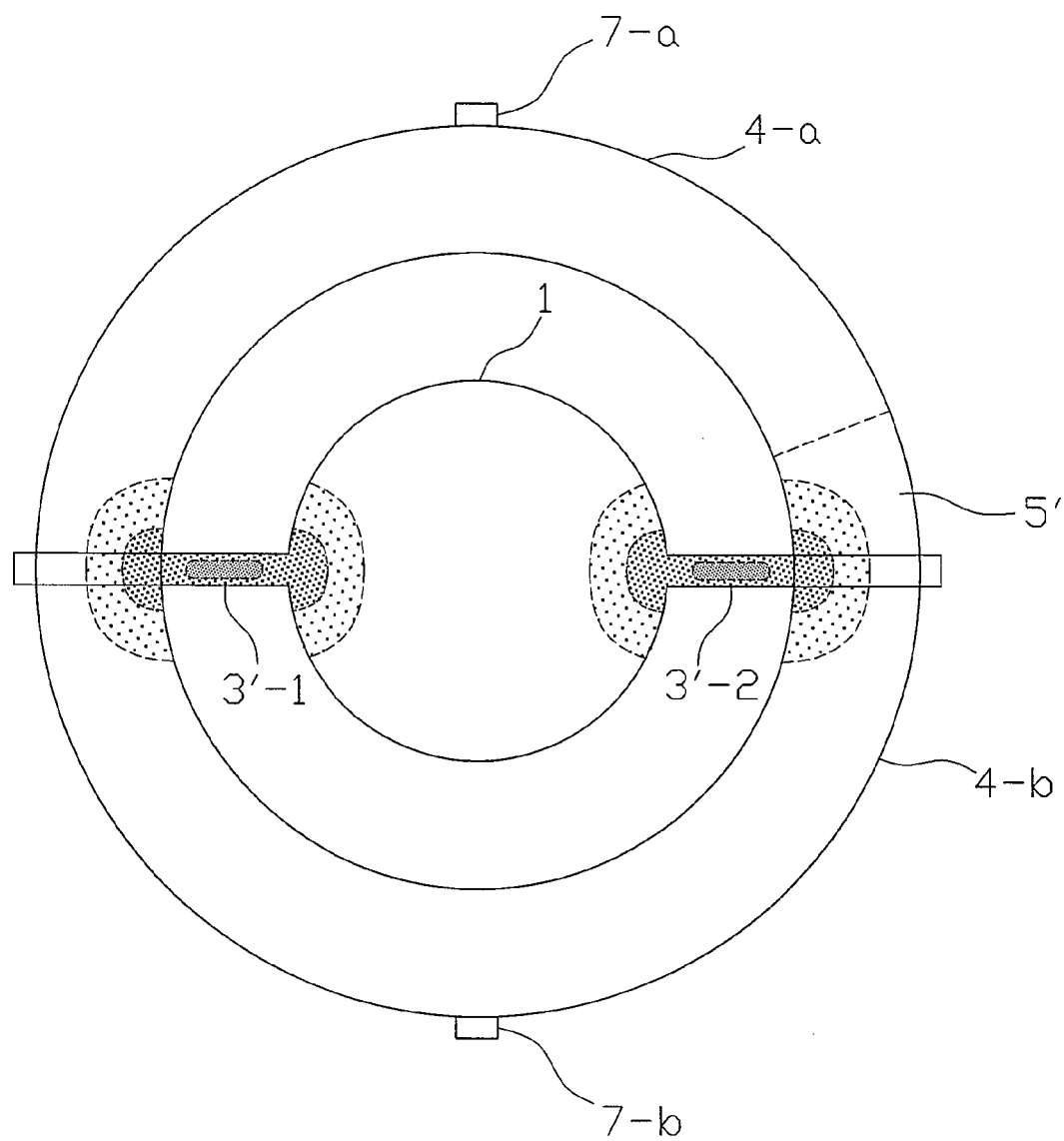
FIG. 27 is a diagram illustrating a simulated stress distribution in the optical deflector of FIG. 25.

When a simulation using the Oofelie-Multiphysics V4.4 (trademark) simulation software provided by Open Engineering was performed upon the one-dimensional optical deflector 10D of FIG. 25, a stress distribution as illustrated in FIG. 27 was obtained in the one-dimensional optical deflector 10D of FIG. 25. In FIG. 27, the stronger stress, whether it is a compression stress or a tension stress, is shown as darker in the illustration. That is, the stress distribution of FIG. 27 is a little broader than that of FIG. 24. Even in this case, the piezoelectric sensor elements 5'-1 and 5'-2 than the piezoelectric sensor element 5'-3, 5'-4 and 5'-5 are susceptible to the stress generated in the one-dimensional optical deflector 10D of FIG. 25.

As illustrated in FIG. 26, the piezoelectric sensor elements 5'-1 connected to the pad P$_{XS}$ have a width smaller than two-fifths (2/5) of the width W' of the semi-ring-shaped piezoelectric actuator 4-a, and are arranged at a wide portion within two-fifths (2/5) of the width W' from the inner end of the semi-ring-shaped piezoelectric actuator 4-a.

Figure 28:
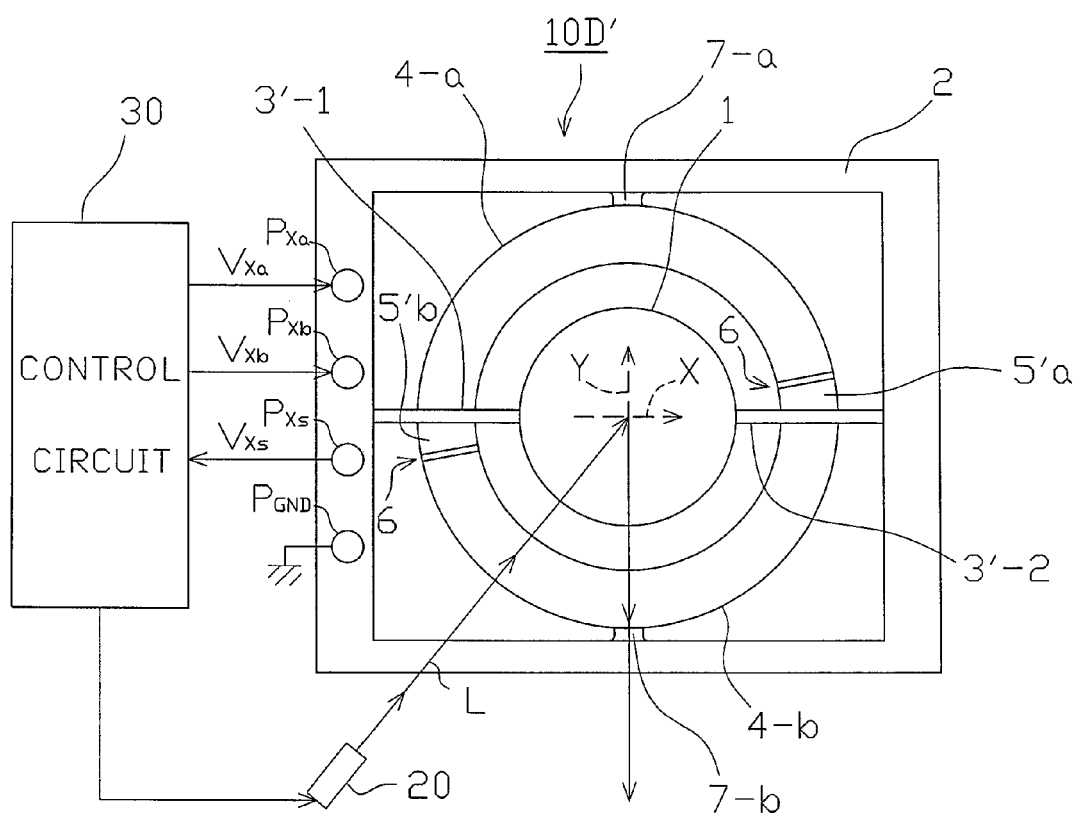
FIG. 28 is a plan view illustrating a modification of the optical deflector of FIG. 22.

Each of the above-described embodiments includes only one piezoelectric sensor; however, the presently disclosed subject matter can be a one-dimensional optical deflector including two piezoelectric sensors. For example, as illustrated in FIG. 28, which is a modification of the optical deflector 10D of FIG. 25, a one-dimensional optical deflector 10D' includes two piezoelectric sensors 5'a and 5'b which have the same structure as that of the piezoelectric sensor 5 of FIG. 25. Also, the piezoelectric sensors 5'a and 5'b are symmetrical with respect to the center of the optical deflector 10D' of FIG. 28. Therefore, the semi-ring-shaped piezoelectric actuators 4-a and 4-b are symmetrical with respect to the center of the optical deflector 10D' of FIG. 28, so that the drive forces (torques) of the semi-ring-shaped piezoelectric actuators 4-a and 4-b are so balanced as to stabilize the operation of the optical deflector 10W. In addition, since the sense voltages of the piezoelectric sensors 5'a and 5'b are in-phase with each other, a combined sense voltage of the two sense voltages can improve the operation of the optical deflector 10D' of FIG. 28.

Note that the operation of the optical deflector 10A, 10B and 10C of FIGS. 1, 14 and 22 can have, two piezoelectric sensors in the same way as the optical deflector 10D' of FIG. 28.

Figure 29:
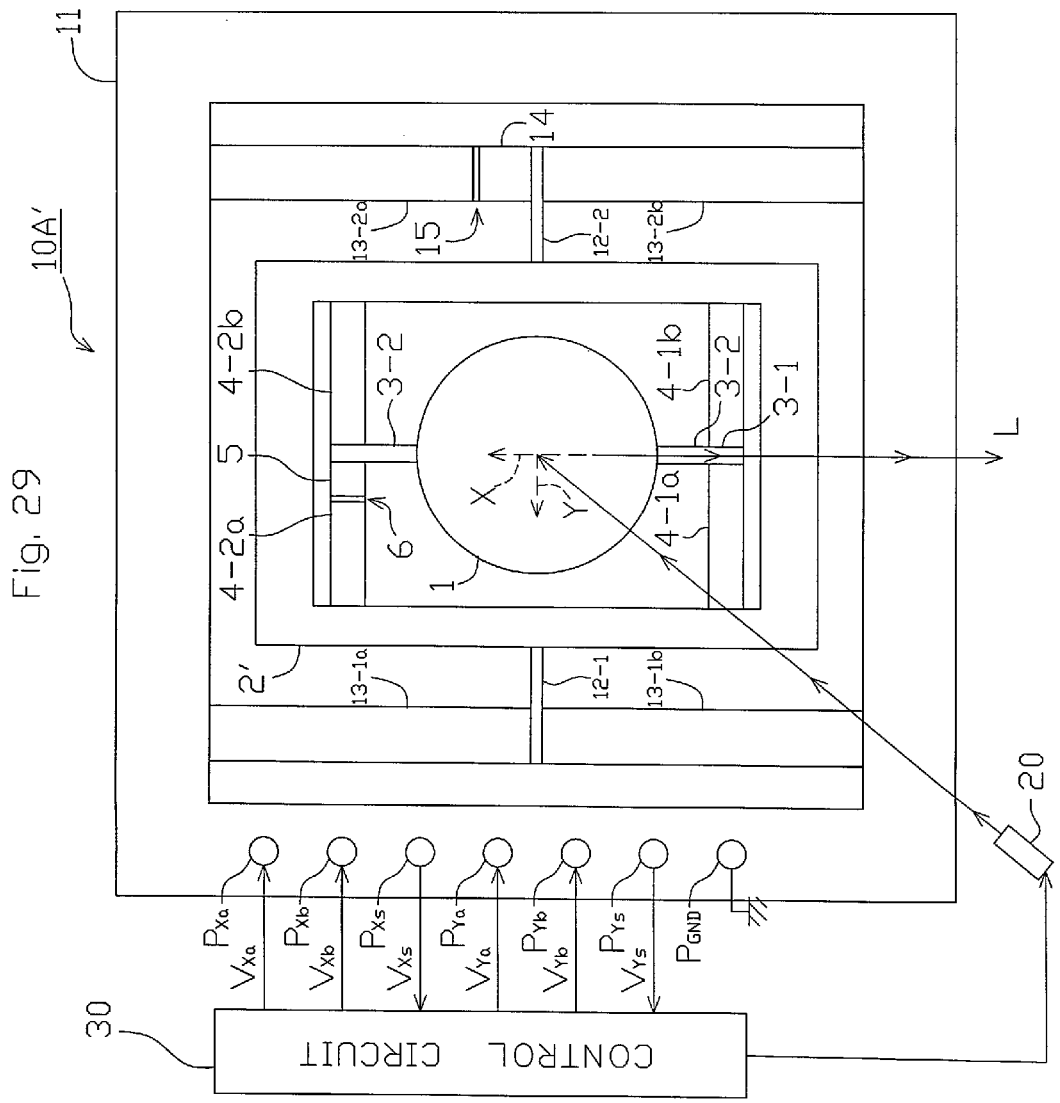
FIG. 29 is a plan view illustrating a modification of the optical deflector of FIG. 1.

The presently disclosed subject matter can be applied to a two-dimensional optical deflector as illustrated in FIG. 29, which is a modification of as the optical deflector 10A of FIG. 1. In FIG. 29, a two-dimensional optical deflector 10A' includes a movable rectangular support frame 2' instead of the rectangular support frame 2 of FIG. 1. In this case, the movable rectangular support frame 2' is constructed by the silicon "Device" layers 101 and the silicon dioxide layer 111 in the same way as the torsion bars 3-1 and 3-2.

The two-dimensional optical deflector 10A' is further constructed by a rectangular support frame 11 surrounding the movable rectangular support frame 2', a pair of torsion bars 12-1 and 12-2 arranged along the Y-axis coupled to the outer end of the movable rectangular support frame 2', a pair of linear piezoelectric actuators 13-1a and 13-1b arranged between the rectangular support frame 11 and the torsion bar 13-1, a pair of linear piezoelectric actuators 13-2a and 13-2b arranged between the rectangular support frame 11 and the torsion bar 12-2, and a piezoelectric sensor 14 inserted between the torsion bar 12-2 and the linear piezoelectric actuator 13-2a. Also, a groove 15 is provided to separate the piezoelectric sensor 14 from the linear piezoelectric actuator 13-2a.

In FIG. 29, the movable rectangular support frame 2' is supported by a four-point support at the rectangular support frame 11.

The linear piezoelectric actuators 13-1a, 13-1b, 13-2a and 13-2b serve as cantilevers for rocking the circular mirror 1 with respect to the Y-axis through the torsion bars 12-1 and 12-2.

In more detail, the linear piezoelectric actuator 13-1a opposes the linear piezoelectric actuator 13-1b along the X-axis and sandwich the torsion bar 12-1. In this case, the flexing direction of the linear piezoelectric actuator 13-1a is opposite to that of the linear piezoelectric actuator 13-1b. Similarly, the linear piezoelectric actuator 13-2a opposes the linear piezoelectric actuator 13-2b along the X-axis and sandwich the torsion bar 12-2. In this case, the flexing direction of the linear piezoelectric actuator 13-2a is opposite to that of the linear piezoelectric actuator 13-2b. Therefore, the torsion bars 12-1 and 12-2 are twisted by the linear piezoelectric actuators 13-1a, 13-1b, 13-2a and 13-2b to rock the circular mirror 1 with respect to the Y-axis.

Provided on the rectangular support frame 11 are pads P$_{Xa}$, P$_{Xb}$, P$_{XS}$, P$_{Ya}$, P$_{Yb}$, P$_{YS}$ and P$_{GND}$. The pads P$_{Ya}$, P$_{Yb}$ and P$_{YS}$ as well as the pads P$_{Xa}$, P$_{Xb}$, P$_{XS}$ are connected to the control circuit 30.

The control circuit 30 supplies a sinusoidal-wave drive voltage V$_{Ya}$ to the pad P$_{Ya}$ which is connected to the Pt upper electrode layers of the linear piezoelectric actuators 13-1a and 13-2a, thus driving the linear piezoelectric actuators 13-1a and 13-2a. On the other hand, the control circuit 30 supplies a sinusoidal-wave drive voltage V$_{Yb}$ opposite in phase to the sinusoidal-wave drive voltage V$_{Ya}$ to the pad P$_{Yb}$ which is connected to the Pt upper electrode layers of the linear piezoelectric actuators 13-1b and 13-2b, thus driving the linear piezoelectric actuators 13-1b and 13-2b.

Also, the control circuit 30 receives a sense voltage V$_{YS}$ from the pad P$_{YS}$ which is connected to the Pt upper electrode layers of the piezoelectric sensor 14, and controls the sinusoidal-wave drive voltages V$_{Ya}$ and V$_{Yb}$ by the feedback of the sense voltage V$_{YS}$ thereto.

Note that the pad P$_{GND}$ is further connected to the Pt lower electrode layers of the linear piezoelectric actuators 13-1a, 13-1b, 13-2a, 13-2b and the piezoelectric sensor 14.

Generally, the frequency f$_Y$ of the sinusoidal-wave drive voltages V$_{Ya}$ and V$_{Yb}$ is smaller the frequency f$_X$ of the sinusoidal-wave drive voltages V$_{Xa}$ and V$_{Xb}$.

The rectangular support frame 11 is constructed by the silicon "Device" layers 101, the silicon dioxide "Box" layer 102, the silicon "Handle" layer 103 and the silicon dioxide layers 104 and 111 in the same way as the rectangular support frame 2 of FIG. 1.

The torsion bars 12-1 and 12-2, the linear piezoelectric actuator 13-1a, 13-1b, 13-2a and 13-2b, the piezoelectric sensor 14 and the groove 15 have the same structures as the torsion bars 3-1 and 3-2, the linear piezoelectric actuator 4-1a, 4-1b, 4-2a and 4-2b, the piezoelectric sensor 5 and the groove 6, respectively, of FIG. 1.

The piezoelectric sensor 14 has the same structure as the piezoelectric sensor 5 of FIG. 1. That is, the piezoelectric sensor 14 has one or two piezoelectric sensor elements connected to the pad P$_{XS}$ which have a width smaller than two-fifths (⅖) of the width W of the piezoelectric actuator 13-2a, and are arranged at a wide portion within two-fifths (⅖) of the width W from the inner end of the linear piezoelectric actuator 13-2a.

Figure 30:
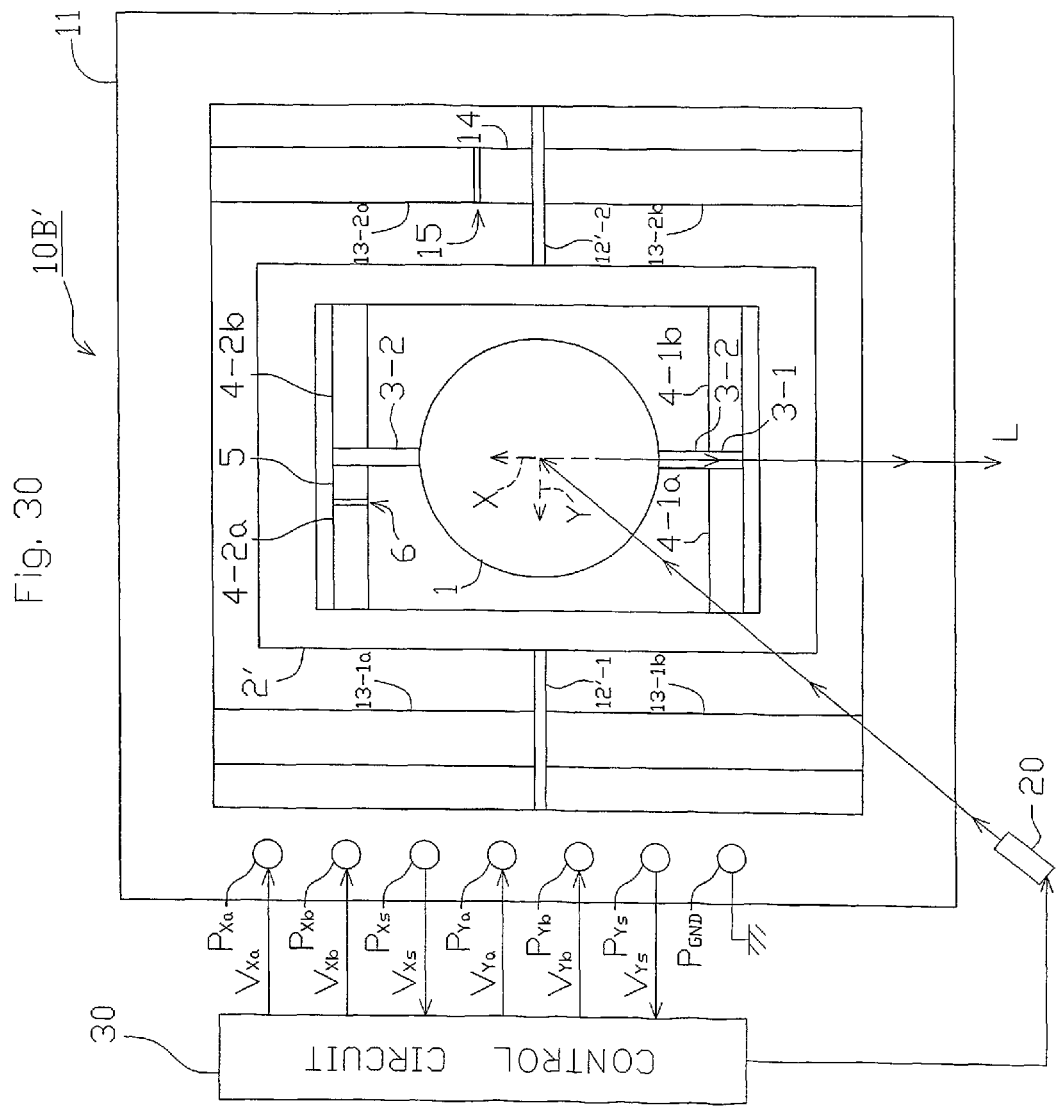
FIG. 30 is a plan view illustrating a modification of the optical deflector of FIG. 14.

Also, FIG. 30 illustrates a two-dimensional optical deflector 10B' which is a modification of the optical deflector 10B of FIG. 14, torsion bars 12'-1 and 12'-2 and a piezoelectric sensor 14' provided instead of the torsion bars 12-1 and 12-2 and the piezoelectric sensor 14 of FIG. 29. The torsion bars 12'-1 and 12'-2 and coupled between the outer end of the movable rectangular support frame 2' and the inner end of the rectangular support frame 11. Since the movable rectangular support frame 2' is supported by a six-point support at the rectangular support frame 11, the support of the movable rectangular support frame 2' is more stable in the optical deflector 10B' of FIG. 30 than in the optical deflector 10A' of FIG. 29.

The piezoelectric sensor 14 has the same structure as the piezoelectric sensor 5 of FIG. 15. That is, the piezoelectric sensor 14 has one or two piezoelectric sensor elements connected to the pad $P_{XS}$ which have a width smaller than two-fifths (⅖) of the width W of the linear piezoelectric actuator 13-2a, and are arranged at a wide portion within two-fifths (⅖) of the width W from the inner end of the linear piezoelectric actuator 13-2a.

Note that the one-dimensional optical deflectors 10C, 10D and 10D' of FIGS. 22, 25 and 28 can be modified into two-dimensional optical deflectors, in the same way as the two-dimensional optical deflectors 10A' and 10B' of FIGS. 29 and 30.

In the above-described embodiments and modifications as illustrated in FIGS. 1, 14, 22, 25, 28 and 29, two torsion bars are provided for the X-axis of the mirror 1; however, a single torsion bar can be provided for the X-axis of the mirror 1. Also, in the above-described modifications as illustrated in FIGS. 29 and 30, two torsion bars are provided for the Y-axis of the mirror 1; however, a single torsion bar can be provided for the Y-axis of the mirror 1.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. An optical deflector comprising:
   a mirror;
   a first support frame surrounding said mirror;
   a first torsion bar arranged along a first axis of said mirror, a first end of said first torsion bar being coupled to an outer circumference of said mirror;
   a pair of first piezoelectric actuators arranged between said first support frame and said first torsion bar; and
   a first piezoelectric sensor inserted between said first torsion bar and one of said first piezoelectric actuators,
   wherein said first piezoelectric sensor includes at least one first piezoelectric sensor element having a width smaller than two-fifths of a width of the one of said first piezoelectric actuators and being arranged at a wide portion within two-fifths of said width from an inner end of the one of said first piezoelectric actuators, and
   wherein said first piezoelectric sensor element is directly adjacent to said first torsion bar.

2. The optical deflector as set forth in claim 1, wherein said first piezoelectric sensor further comprises at least one first inactivated piezoelectric sensor element on one side of said first piezoelectric sensor element.

3. The optical deflector as set forth in claim 1, wherein said first piezoelectric sensor further comprises at least one first grounded conductive layer on one side of said first piezoelectric sensor element.

4. The optical deflector as set forth in claim 2, wherein a conductive layer of said first piezoelectric sensor element serving as an output terminal thereof and a conductive layer of said first inactivated piezoelectric sensor element serving as an output terminal thereof extend over the one of said first piezoelectric actuators to reach said first support frame.

5. The optical deflector as set forth in claim 3, wherein a conductive layer of said first piezoelectric sensor element serving as an output terminal thereof and said first grounded conductive layer extend over the one of said first piezoelectric actuators to reach said first support frame.

6. The optical deflector as set forth in claim 2, wherein a second end of said first torsion bar is coupled to said first support frame, and
   wherein a conductive layer of said first piezoelectric sensor element serving as an output terminal thereof and a conductive layer of said first inactivated piezoelectric sensor element serving as an output terminal thereof extend over the second end of said first torsion bar to reach said first support frame.

7. The optical deflector as set forth in claim 3, wherein a second end of said first torsion bar is coupled to said first support frame, and
   wherein a conductive layer of said first piezoelectric sensor element serving as an output terminal thereof and said first grounded conductive layer extend over the second end of said first torsion bar to reach said first support frame.

8. The optical deflector as set forth in claim 1, further comprising:
   a second support frame surrounding said first support frame;
   a second torsion bar arranged along a second axis of said mirror perpendicular to said first axis, a first end of said second torsion bar being coupled to an outer end of said first support frame;
   a pair of second piezoelectric actuators arranged between said second support frame and said second torsion bar; and
   a second piezoelectric sensor inserted between said second torsion bar and one of said second piezoelectric actuators,
   wherein said second piezoelectric sensor includes at least one second piezoelectric sensor element having a width smaller than two-fifths of a width of the one of said second piezoelectric actuators and being arranged at a wide portion within two-fifths of said width from an inner end of the one of said second piezoelectric actuators, and
   wherein said second piezoelectric sensor element is directly adjacent to said second torsion bar.

9. The optical deflector as set forth in claim 8, wherein said second piezoelectric sensor further comprises at least one second inactivated piezoelectric sensor element on one side of said second piezoelectric sensor element.

10. The optical deflector as set forth in claim 8, wherein said second piezoelectric sensor further comprises at least one second grounded conductive layer on one side of said second piezoelectric sensor element.

11. The optical deflector as set forth in claim 9, wherein a conductive layer of said second piezoelectric sensor element serving as an output terminal thereof and a conductive layer of said second inactivated piezoelectric sensor element serving as an output terminal thereof extend over the one of said second piezoelectric actuators to reach said second support frame.

12. The optical deflector as set forth in claim 10, wherein a conductive layer of said second piezoelectric sensor element serving as an output terminal thereof and said second grounded conductive layer extend over the one of said second piezoelectric actuators to reach said second support frame.

13. The optical deflector as set forth in claim 9, wherein a second end of said second torsion bar is coupled to said second support frame, and
wherein a conductive layer of said second piezoelectric sensor element serving as an output terminal thereof and a conductive layer of said second inactivated piezoelectric sensor element serving as an output terminal thereof extend over said second torsion bar to reach said second support frame.

14. The optical deflector as set forth in claim 10, wherein a second end of said second torsion bar is coupled to said second support frame, and
wherein a conductive layer of said second piezoelectric sensor element serving as an output terminal thereof and said second grounded conductive layer extend over said second torsion bar to reach said second support frame.

15. The optical deflector as set forth in claim 1, wherein:
the one of said first piezoelectric actuators and said first piezoelectric sensor are provided on a substrate,
a width of said first piezoelectric sensor is two-fifths of a width of said substrate on which said first piezoelectric sensor is provided, and
said first piezoelectric sensor is arranged at an inner width portion within two-fifths of said width of said substrate on which said first piezoelectric sensor is provided.

16. The optical deflector as set forth in claim 15, wherein:
said substrate is linear so as to link said first torsion bar and said first support frame,
the one of said first piezoelectric actuators and said first piezoelectric sensor are separated by a groove, and
the one of said piezoelectric actuators is adjacent to a connecting portion between said first torsion bar and said substrate, and satisfies:

$$L_{4a}/6 < L5 < L_{4a}/3,$$

wherein $L_{4a}$ is a length of the one of said first piezoelectric actuators, and L5 is a length of said first piezoelectric sensor.

17. The optical deflector as set forth in claim 15, wherein:
said substrate is curved so as to link said first torsion bar and said first support frame,
said substrate is coupled perpendicularly to said first torsion bar,
the one of said first piezoelectric actuators and said first piezoelectric sensor are separated by a groove,
the one of said piezoelectric actuators is adjacent to a connecting portion between said first torsion bar and said substrate, and satisfies:

$$L_{4a}'/6 < L5' < L_{4a}'/3,$$

wherein $L_{4a}'$ is a curved length of the one of said first piezoelectric actuators, and L5' is a curved length of said first piezoelectric sensor.

18. The optical deflector as set forth in claim 15, wherein the width of said substrate on which the one of said first piezoelectric actuators and said first piezoelectric sensor are provided is constant.

* * * * *